United States Patent
Tanabe et al.

(10) Patent No.: US 6,868,021 B2
(45) Date of Patent: Mar. 15, 2005

(54) RAPIDLY TESTABLE SEMICONDUCTOR MEMORY DEVICE

(75) Inventors: Tetsuya Tanabe, Kanagawa (JP); Nobutaka Nasu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/669,532

(22) Filed: Sep. 25, 2003

(65) Prior Publication Data

US 2004/0062096 A1 Apr. 1, 2004

Related U.S. Application Data

(60) Provisional application No. 60/413,783, filed on Sep. 27, 2002.

(51) Int. Cl.$^7$ .................................................. G11C 7/00
(52) U.S. Cl. ................... 365/200; 365/201; 365/189.07
(58) Field of Search ................................. 365/200, 201, 365/189.07, 230.03, 230.08

(56) References Cited

U.S. PATENT DOCUMENTS 5,621,691 A    4/1997 Park
5,914,907 A  *  6/1999 Kobayashi et al. .... 365/230.03
6,269,033 B1    7/2001 Ishida et al.

FOREIGN PATENT DOCUMENTS

JP      08-077791 A      3/1996
JP      2001-35181 A     2/2001

* cited by examiner

*Primary Examiner*—David Lam
(74) *Attorney, Agent, or Firm*—Nixon Peabody LLP; Donald R. Studebaker

(57) ABSTRACT

A semiconductor memory device has an array of memory cells, an array of sense amplifiers selected at least two at a time by column lines, data bus lines that receive data read from the memory cell array by the selected sense amplifiers, a decision circuit that compares data read by two of the selected sense amplifiers, and an input-output buffer. Normally, the input-output buffer receives and outputs data from one or more of the data bus lines. In a test output mode, the input-output buffer receives and outputs comparison result data from the decision circuit. In a semiconductor memory device with multiple memory cell arrays, this arrangement enables data read from different memory cells in the same memory cell array to be compared, so that redundancy repair can be carried out efficiently.

19 Claims, 25 Drawing Sheets

| FIG.1 | |
|---|---|
| FIG.1A | FIG.1B |

RAPIDLY TESTABLE SEMICONDUCTOR MEMORY DEVICE

BACKGROUND OF THE INVENTION

1. Field of the Invention

The present invention relates to redundancy repair of a semiconductor memory device. More particularly, it relates to the rapid identification and efficient repair of defective memory cells.

2. Description of the Related Art

Large-scale integrated semiconductor memory devices generally have redundant rows or columns of memory cells that can be used to replace defective rows or columns if the defect is found before the device is packaged. Defects can be found by writing known data into all memory cells, then reading the data, but this type of test takes considerable time. A faster way to test the memory device is to write known data into all memory cells, then compare the data in pairs of memory cells and read the comparison results, thereby reducing the read-out time by half.

A conventional semiconductor memory device employing this type of comparison test includes a plurality of memory cell arrays. After identical data have been written into all of the memory cell arrays, two of the memory cell arrays are selected and data from corresponding memory cells in the two arrays are read simultaneously onto complementary pairs of data bus lines. If the data match, then in each pair of data bus lines, one line will go high and the other line will go low, whereas non-matching data will cause both lines to go to the same logic level, e.g., both to the low level. In the comparison test output mode, the input-output buffer connected to the complementary pair of data bus lines functions as, for example, an OR gate, producing high output in the normal (matching) case and low output in the defective (non-matching) case.

A problem with this scheme is that when a defective bit is detected, it is not known which of the two memory cells being compared is defective. Since these two memory cells are located in different memory cell arrays, it is not known which memory cell array should be repaired. Accordingly, after a defective bit has been detected, a further test is needed to isolate the defect to a particular memory cell array.

If the memory device has redundant columns and each redundant column spans all the memory cell arrays, a conventional arrangement that has often been used in the past, the above problem becomes irrelevant, since both of the compared memory cells are replaced. This conventional arrangement unduly limits the number of defects that can be repaired, however. If a defect in a particular column is limited to a particular memory cell array, it is obviously inefficient to replace the same column in other, non-defective memory cell arrays.

It would be desirable if a defect could be detected and isolated to a single memory cell array in a single step, and if the defect could be repaired by replacing memory cells only in the defective memory cell array.

SUMMARY OF THE INVENTION

A general object of the present invention is to speed up the testing of a semiconductor memory device.

Another general object of the invention is to increase the number of defects that can be repaired in a semiconductor memory device.

A more specific object is to provide a semiconductor memory device that can be tested by comparing data in different memory cells in the same memory cell array.

Another more specific object is to provide a semiconductor memory device that can be repaired by replacing only memory cells in a single memory cell array that are read by a single sense amplifier array.

A semiconductor memory device according to the present invention has at least one array of memory cells, an array of sense amplifiers for reading data from the array of memory cells, a plurality of column lines by which the sense amplifiers are selected, a plurality of data bus lines receiving the data read by the selected sense amplifiers, a decision circuit that receives and compares data read by two of the selected sense amplifiers, and an input-output buffer.

The semiconductor memory device is operable in a normal output mode and a test output mode. In the normal output mode, the input-output buffer receives data from one or more of the data bus lines, and outputs the received data. In the test output mode, the input-output buffer receives comparison result data from the decision circuit and outputs the comparison result.

The semiconductor memory device may have a plurality of memory cell arrays interspersed among a plurality of sense amplifier arrays, the data stored in each memory cell array being read by sense amplifiers in two adjacent sense amplifier arrays. In this case, a separate decision circuit may be provided for each sense amplifier array, and comparison results from two or more decision circuits may be output in parallel through two or more input-output buffers. When a non-matching comparison result indicates a defective memory cell, the defect can be repaired by replacing only that part of a column that is disposed in one of the memory cell arrays and read by one of the sense amplifier arrays. Then even if a memory cell array has only one redundant column of memory cells, defective memory cells in two different columns can both repaired if they are read by different sense amplifier arrays.

A semiconductor memory device with multiple memory cell arrays and sense amplifier arrays may have primary decision circuits that compare data read by sense amplifiers as described above, and secondary decision circuits that compare the result data produced by adjacent pairs of primary decision circuits. In this case four memory cells located in the same column in the same memory cell array can be tested at once. Such a memory device can be operated in a first test output mode providing external output of the comparison results from the primary decision circuits, and a second test output mode providing external output of the comparison results from the secondary decision circuits. The first test output mode can be advantageously used for redundancy repair, and the second test output mode for pass-fail screening.

Tertiary decision circuits may be provided to compare the results obtained by the secondary decision circuits. The tertiary decision circuits can be advantageously used to output screening test results through a reduced number of external input-output terminals.

DETAILED DESCRIPTION OF THE INVENTION

Figure 1A:
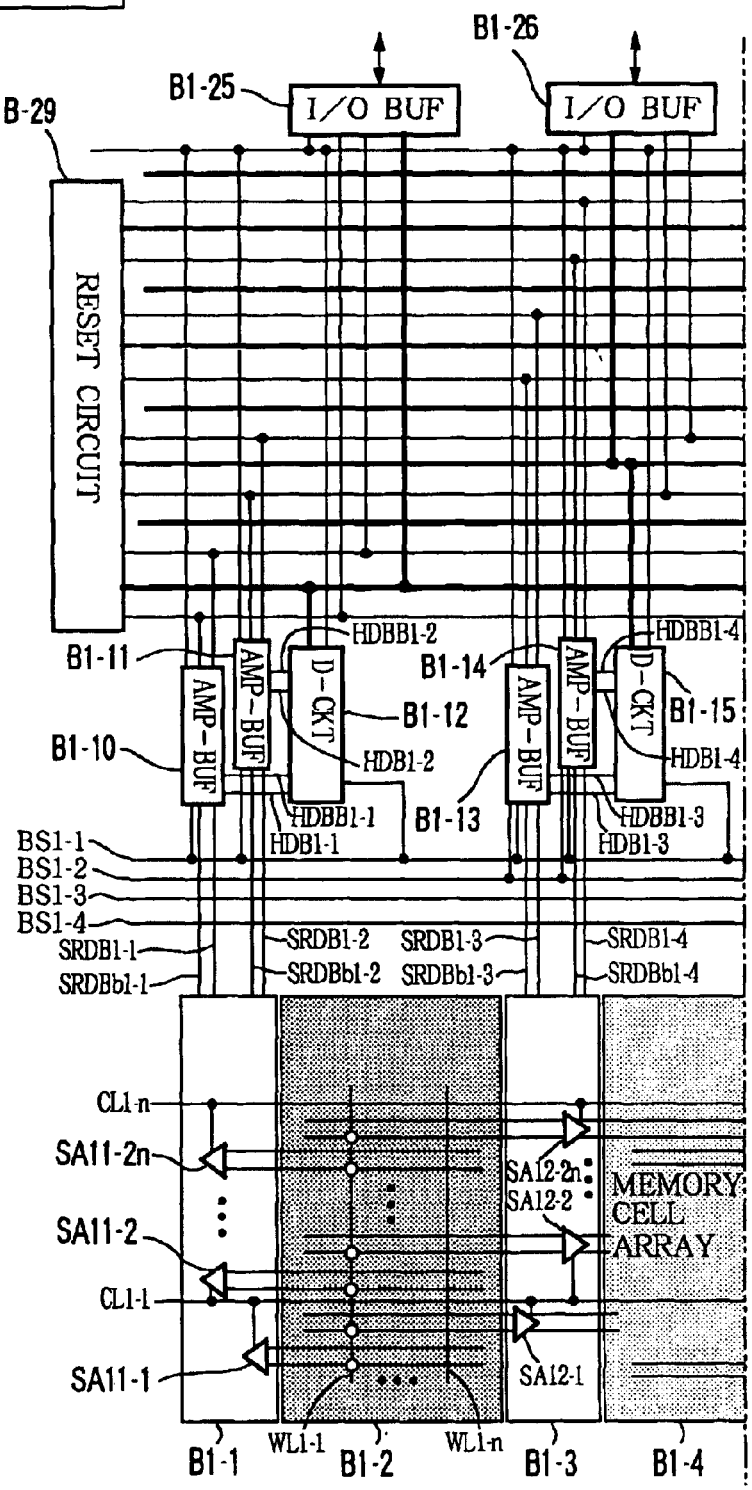
FIG. 1, consisting of FIGS. 1A and 1B, is a block diagram of a semiconductor memory device illustrating a first embodiment of the invention.

Embodiments of the invention will now be described with reference to the attached drawings, in which like elements are indicated by similar reference characters.

First Embodiment

Figure 1B:
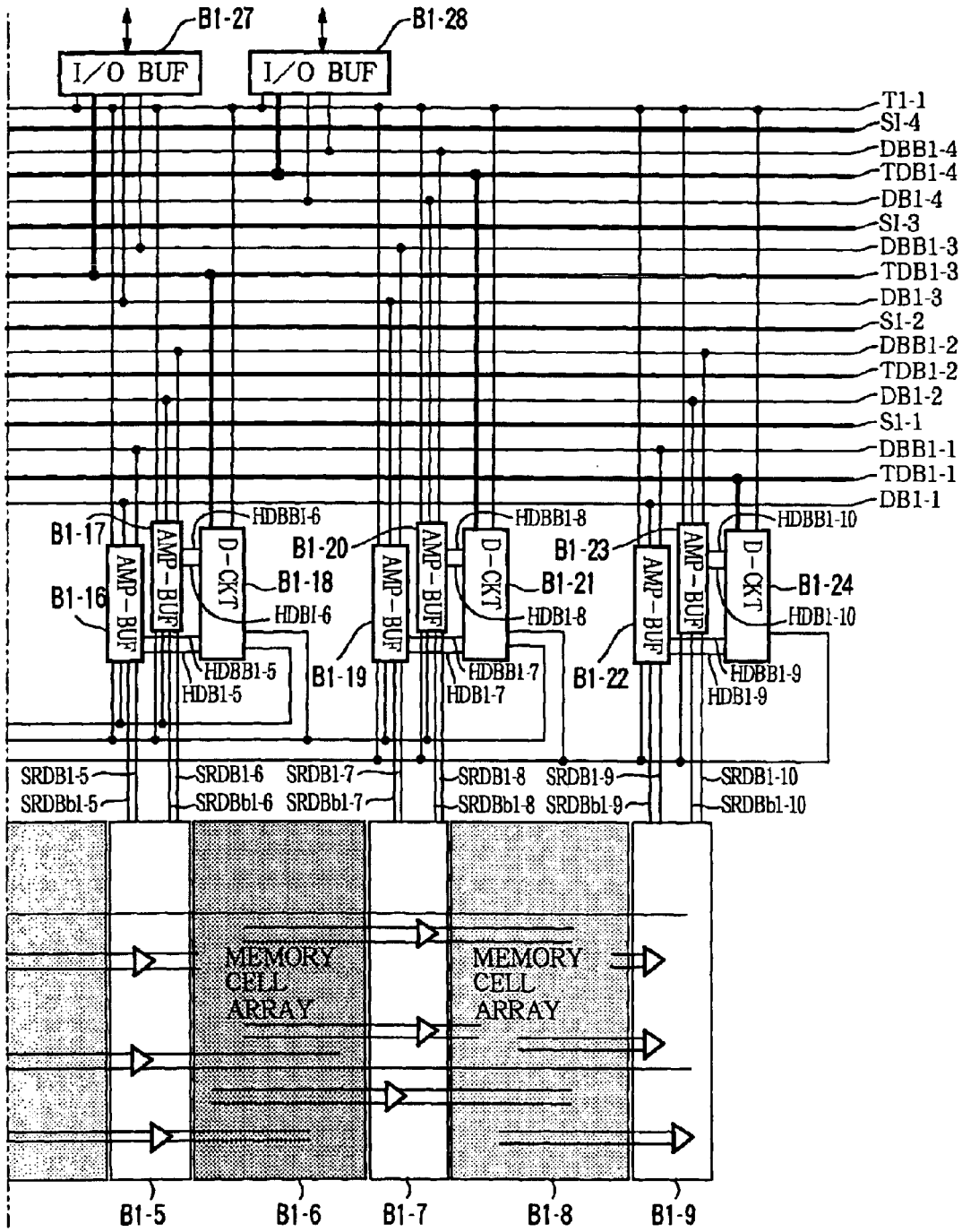

Referring to FIGS. 1A and 1B, the first embodiment of the invention is a semiconductor memory device comprising four memory cell arrays B1-2, B1-4, B1-6, B1-8 interspersed among five sense amplifier arrays B1-1, B1-3, B1-5, B1-7, B1-9. The memory cell arrays are spanned by n column lines CL1-1 to CL1-n, where n is an integer greater than one. Each column line activates four sense amplifiers adjacent each memory cell array: for example, the first column line CL1-1 activates sense amplifiers SA11-1 and SA11-2 in the sense amplifier array B1-1 on one side of memory cell array B1-2 and sense amplifiers SA12-1 and SA12-2 in the sense amplifier array B1-3 on the other side of memory cell array B1-2. Each sense amplifier is coupled to a complementary pair of bit lines extending across the adjacent memory cell array or arrays. Each memory cell array includes n word lines WL1-1 to WL1-n, and n×n memory cells, indicated by white circles, disposed at alternate intersections of the word lines and the complementary bit lines.

Besides these 4×n×n memory cells, the memory device includes redundant memory cells and other redundancy repair circuitry, which will be shown later.

The semiconductor memory device also includes a plurality of output amplifier-input buffers (AMP-BUF) and decision circuits (D-CKT). The even-numbered sense amplifiers in sense amplifier array B1-1 are coupled by a complementary pair of read data bus lines SRDB1-1, SRDBb1-1 to output amplifier-input buffer B1-10, which provides amplified read data via a complementary pair of comparison data bus lines HDB1-1, HDBB1-1 to decision circuit B1-12. The odd-numbered sense amplifiers in sense amplifier array B1-1 are coupled by a complementary pair of read data bus lines SRDB1-2, SRDBb1-2 to output amplifier-input buffer B1-11, which provides amplified read data via a complementary pair of comparison data bus lines HDB1-2, HDBB1-2 to decision circuit B1-12. The sense amplifiers in sense amplifier arrays B1-3, B1-5, B1-7, and B1-9 are similarly coupled by read data bus lines SRDB1-3, SRDBb1-3, . . . , SRDB1-10, SRDBb1-10 to output amplifier-input buffers B1-13, B1-14, B1-16, B1-17, B1-19, B1-20, B1-22, B1-23, which provide amplified data via complementary pairs of comparison data bus lines HDB1-3, HDBB1-3, . . . , HDB1-10, HDBB1-10 to decision circuits B1-15, B1-18, B1-21, and B1-24.

The output amplifier-input buffers and decision circuits are activated by four block select signals BS1-1 to BS1-4. Each block select signal activates the output amplifier-input buffers and decision circuits associated with one memory cell array. For example, block select signal BS1-1 activates output amplifier-input buffers B1-10, B1-11, B1-13, B1-14 and decision circuits B1-12 and B1-15, which are associated with memory cell array B1-2.

The output amplifier-input buffers are also coupled via complementary pairs of data bus lines to four input-output buffers. Specifically, output amplifier-input buffers B1-10, B1-16, and B1-22 are coupled to data bus lines DB1-1 and DBB1-1, which are coupled to input-output buffer B1-25; output amplifier-input buffers B1-11, B1-17, and B1-23 are coupled to data bus lines DB1-2 and DBB1-2, which are coupled to input-output buffer B1-26; output amplifier-input buffers B1-13 and B1-19 are coupled to data bus lines DB1-3 and DBB1-3, which are coupled to input-output buffer B1-27; and output amplifier-input buffers B1-14 and B1-20 are coupled to data bus lines DB1-4 and DBB1-4, which are coupled to input-output buffer B1-28. The input-output buffers B1-25 to B1-28 are coupled to respective external data terminals for parallel input and output of four bits of data.

Four test data bus lines TDB1-1 to TDB1-4 are disposed between the four complementary pairs of data bus lines. For example, test data bus line TDB1-1 is disposed between complementary data bus lines DB1-1 and DBB1-1. The test data bus lines TDB1-1 to TDB1-4 are coupled to respective decision circuits and input-output buffers. For example, test data bus line TDB1-1 is coupled to decision circuit B1-12 and input-output buffer B1-25. The data bus lines and test data bus lines are also coupled to a reset circuit B1-29.

A test control signal line T1-1 is coupled to the output amplifier-input buffers, the decision circuits, the four input-output buffers B1-25 to B1-28, and the reset circuit B1-29. When the test control signal T1-1 is active (high), the output amplifier-input buffers are internally disconnected from the data bus lines, the decision circuits are enabled, the input-output buffers output the data received from the test data bus lines TDB1-1 to TDB1-4 at the external data terminals, and the reset circuit B1-29 holds the data buses at a fixed potential level such as the ground level or power-supply level. When the test control signal T1-1 is inactive (low), the output amplifier-input buffers are connected to the data bus lines, the decision circuits are disabled, the input-output buffers transfer data between the data bus lines and the external data terminals, and the reset circuit B1-29 holds the test data bus lines at a fixed potential level.

Shield lines S1-1 to S1-4 are provided between data bus lines DBB1-1 and DB1-2, DBB1-2 and DB1-3, and DBB1-3 and DB1-4, and between data bus line DBB1-4 and the test control signal line T1-1. The shield lines are held at a fixed potential such as the ground potential or the power-supply potential to prevent capacitive coupling between data bus lines carrying different data, thereby preventing crosstalk and associated signal propagation delays.

Figure 2:
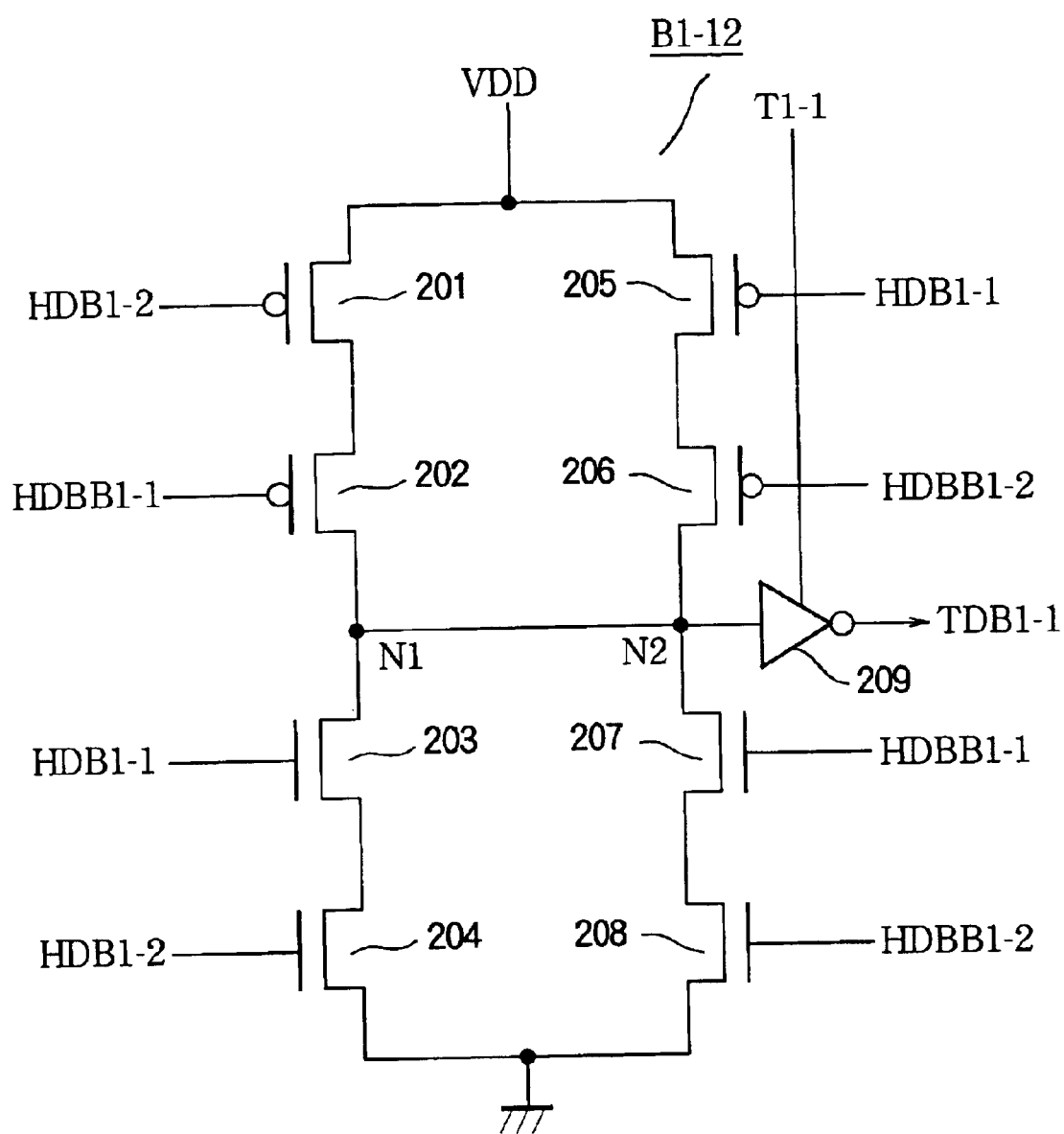
FIG. 2 is a circuit diagram illustrating the internal structure of the decision circuits in FIGS. 1A and 1B.

FIG. 2 shows the internal structure of decision circuit B1-12. Two p-channel metal-oxide-semiconductor (PMOS) transistors 201, 202 and two n-channel metal-oxide-semiconductor (NMOS) transistors 203, 204 are coupled in series between the power supply (VDD) and ground. Further PMOS transistors 205, 206 and NMOS transistors 207, 208 are coupled in series on another path between the power supply and ground. Comparison data bus line HDB1-1 is connected to the gate electrodes of NMOS transistor 203 and PMOS transistor 205; comparison data bus line HDBB1-1 is connected to the gate electrodes of PMOS transistor 202 and NMOS transistor 207; comparison data bus line HDB1-2 is connected to the gate electrodes of PMOS transistor 201 and NMOS transistor 204; comparison data bus line HDBB1-2 is connected to the gate electrodes of PMOS transistor 206 and NMOS transistor 208. The drain node N1 of PMOS transistor 202 and NMOS transistor 203 and the drain node N2 of PMOS transistor 206 and NMOS transistor 207 are coupled to the input terminal of a tri-state inverter 209. The output terminal of tri-state inverter 209 is coupled to test data bus line TDB1-1. The tri-state inverter 209 is enabled and disabled by the test control signal T1-1, driving the test data bus line TDB1-1 to the high or low logic level when the test control signal T1-1 is active (high), but not driving the test data bus line TDB1-1 when the test control signal T1-1 is inactive (low).

Due to these interconnections, when identical data are output on comparison data buses HDB1-1 and HDB1-2, and identical complementary data are output on data buses HDBB1-1 and HDBB1-2, either node N1 or node N2 is pulled down to the ground level, causing tri-state inverter 209 (if enabled) to drive test data bus TDB1-1 to the high logic level. When non-identical data are output on comparison data buses HDB1-1 and HDB1-2, and non-identical complementary data are output on data buses HDBB1-1 and HDBB1-2, either node N1 or node N2 is pulled up to the power-supply level, causing tri-state inverter 209 (if enabled) to drive test data bus TDB1-1 to the low logic level.

The other decision circuits B1-15, B1-18, B1-21 have a similar structure.

Next, the operation of the circuits in FIGS. 1A, 1B, and 2 during normal operation and in the test output mode will be described.

In normal read access, an address is received selecting a memory cell array, a row in the memory cell array, and a column. If, for example, the first row and column in memory cell array B1-2 are selected, then block select signal BS1-1, word line WL1-1, and column line CL1-1 are activated. Data stored in four memory cells are sensed by sense amplifiers SA11-1, SA11-2, SA12-1, SA12-2, amplified by output amplifier-input buffers B1-10, B1-11, B1-13, B1-14, and output on the data bus lines, which have been precharged by the reset circuit B1-29 to the high logic level. If, for example, the first of the four bits is sensed as a '1', output amplifier-input buffer B1-10 pulls data bus line DBB1-1 down to the low logic level while the complementary data bus line DB1-1 is left high, causing input-output buffer B1-25 to drive the first external data terminal to the high logic level. If this bit is sensed as a '0', data bus line DB1-1 is pulled down to the low logic level while data bus line DBB1-1 is left high, causing input-output buffer B1-25 to drive the first external data terminal to the low logic level. The other bits are read simultaneously in the same way.

In normal write access, four bits of data are received simultaneously at the external data terminals and placed by the input-output buffers B1-25 to B1-28 on the data bus lines. An address is received and one block select signal, one word line, and one column line are activated accordingly. If block select signal BS1-1 is activated, for example, then output amplifier-input buffers B1-10, B1-11, B1-13, B1-14 transfer the data from the data bus lines to the sense amplifier arrays via write data bus lines not shown in FIGS. 1A and 1B. The four bits of data are then placed on four bit lines and written simultaneously into four memory cells.

During normal read and write access, the decision circuits B1-12, B1-15, B1-18, B1-21 are disabled. The test data bus lines TDB1-1 to TDB1-4 are held at a fixed potential by the reset circuit B1-29 and function in the same way as the shield lines to prevent signal propagation delays. Specifically, the capacitive load that must be charged or discharged when the signal on a complementary pair of data bus lines switches between the high and low states is reduced by half, because instead of being capacitively coupled to each other, the two complementary bus lines are capacitively coupled to the fixed potential of a test data bus line.

When the memory device is tested, the same data, such as all '1' data, are written into the memory cells in all four memory cell arrays. Preferably, all four block select signals are activated, and data are written into all four memory cell arrays simultaneously, sixteen bits at a time, via the data bus lines and output amplifier-input buffers.

Next, the test control signal T1-1 is driven high, disconnecting the output amplifier-input buffers from the data bus lines, enabling the decision circuits to drive the test data bus lines, and enabling the input-output buffers to accept data from the test data bus lines. Two memory cell arrays are activated simultaneously, data are read from eight memory cells at a time, and four comparison results are output simultaneously at the external data terminals.

If memory cell arrays B1-2 and B1-6 are selected, for example, then block select signals BS1-1 and BS1-3 are activated, activating output amplifier-input buffers B1-10, B1-11, B1-13, B1-14, B1-16, B1-17, B1-19, B1-20 and decision circuits B1-12, B1-15, B1-18, B1-21. Since the test control signal is active, the output amplifier-input buffers are internally disconnected from the data bus lines, and instead supply their output data to the decision circuits via the comparison data bus lines.

One word line in each of the two selected memory cell arrays is activated, and the column lines are activated one at a time. Before each column line is activated, the reset circuit B1-29 precharges the test data bus lines to the high logic level. When column line CL1-1 is activated, for example, if the data sensed by sense amplifier SA11-1 match the data sensed by sense amplifier SA11-2, both data being '1', then comparison data bus lines HDB1-1 and HDB1-2 are both high and comparison data bus lines HDBB1-1 and HDBB1-2 are both low, so node N1 in decision circuit B1-12 is low, tri-state inverter 209 holds test data bus line TDB1-1 at the high level, and input-output buffer B1-25 drives the first external data terminal to the high level, indicating a normal comparison result. If the data sensed by sense amplifiers SA11-1 and SA11-2 do not match, then either comparison data bus lines HDB1-1 and HDBB1-2 are both low or comparison data bus lines HDBB1-1 and HDB1-2 are both low, so node N1 or N2 in decision circuit B1-12 goes high, tri-state inverter 209 pulls test data bus line TDB1-1 down to the low level, and input-output buffer B1-25 drives the first external data terminal to the low level, indicating an error in the data sensed by either sense amplifier SA11-1 or SA11-2 in memory cell array B1-2.

Similarly, the signal output by input-output buffer B1-26 at the second external data terminal indicates whether the data in memory cell array B1-2 sensed by sense amplifiers SA12-1 and SA12-2 are normal or erroneous. The signals output by input-output buffers B1-27 and B1-28 give similar information about data read from memory cell array B1-6. Each external output bit thus gives a comparison result for two bits read from the same row and column in a single memory cell array by sense amplifiers in a single sense amplifier array.

After all memory cells in all memory cell arrays have been tested in this way, '0' data are written in all the memory cells and a similar test is carried out.

During the reading out of test data, both the data bus lines and the shield lines are held at constant potentials, preventing crosstalk and signal propagation delays due to capacitive coupling.

Figure 3A:
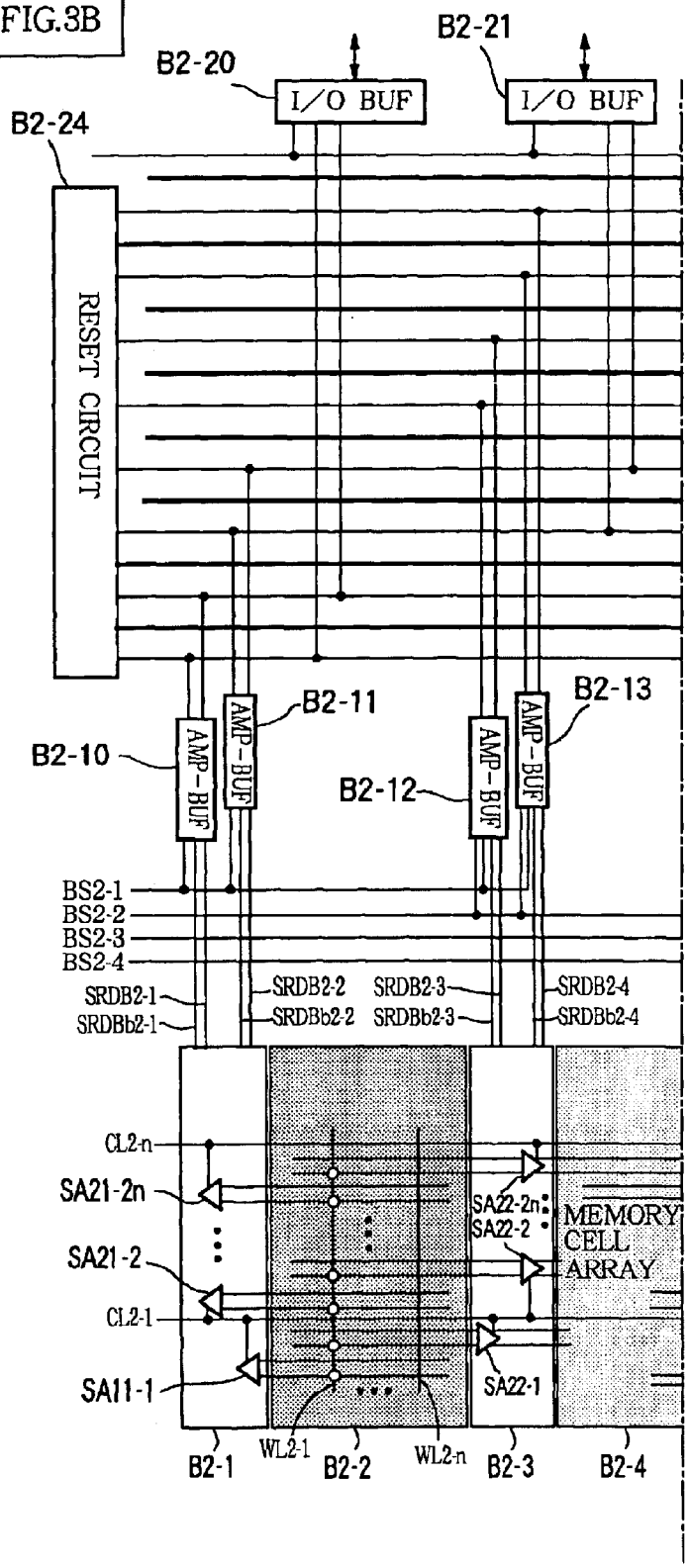
FIG. 3, consisting of FIGS. 3A and 3B, is a block diagram of a conventional semiconductor memory device.
Figure 3B:
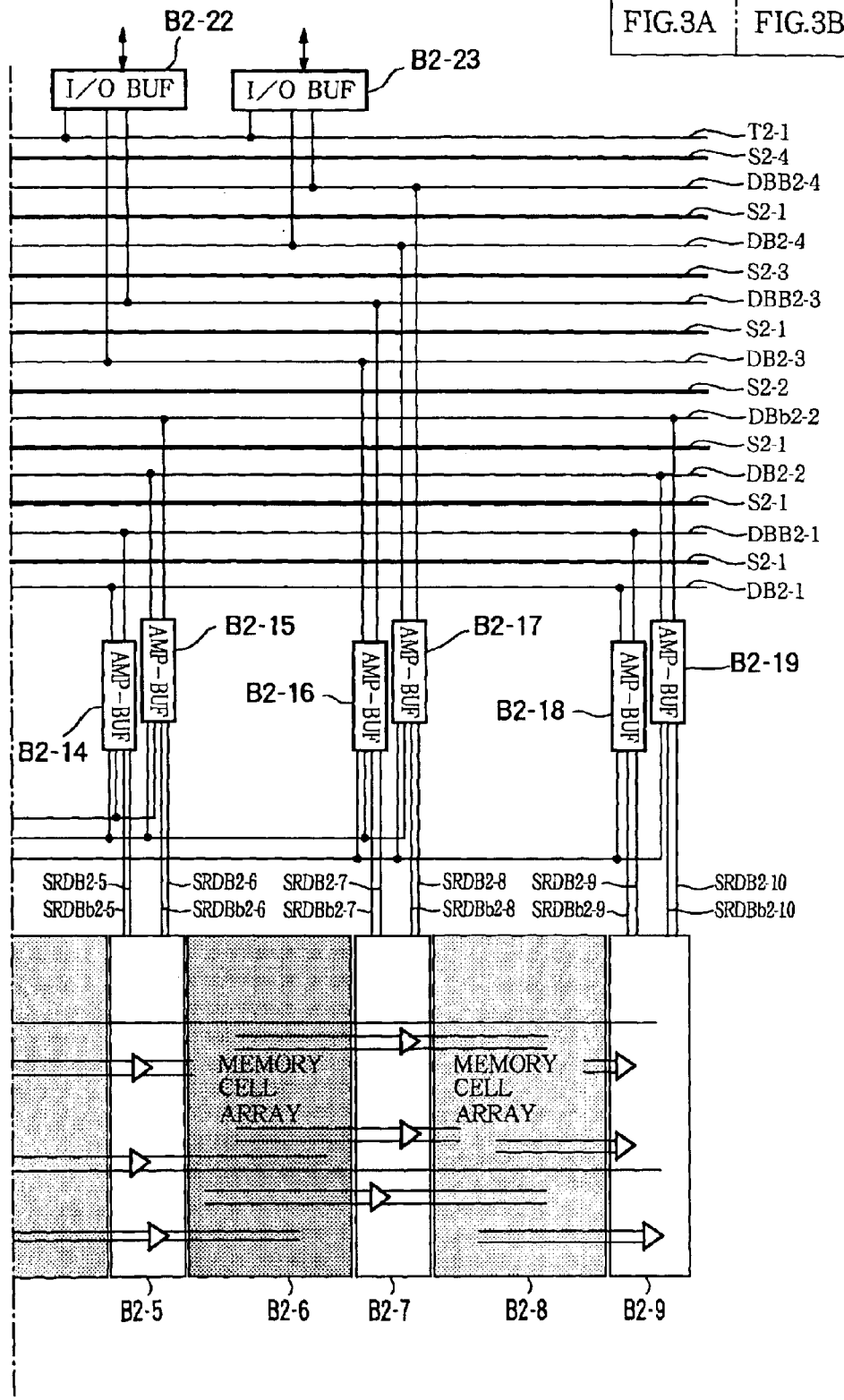

For comparison with the first embodiment, FIGS. 3A and 3B show a conventional semiconductor memory device having a test output mode in which pairs of memory cells in different memory cell arrays are tested by comparing their data. The sense amplifier arrays B2-1, B2-3, B2-5, B2-7, B2-9, memory cell arrays B2-2, B2-4, B2-6, B2-8, output amplifier-input buffers B2-10 to B2-19, block select signal lines BS2-1 to BS2-4, and data bus lines DB2-1, DBB2-1 to DB2-4, DBB2-4 are similar to the corresponding elements in the first embodiment. There are no test data bus lines; shield lines S2-1 to S2-4 are provided between all adjacent pairs of data bus lines, and between data bus line DBB2-4 and the test control signal line T2-1. The test control signal line T2-1 controls only the input-output buffers B2-20 to B2-23.

Normal read and write access are carried out as described in the first embodiment.

In the test output mode, the test control signal T2-1 is activated, causing the input-output buffers B2-20, B2-21, B2-22, B2-23 to operate as OR gates. To test memory cell arrays B2-2 and B2-6, for example, block select signals BS2-1 and BS2-3 are both activated. When the first column line CL2-1 is activated, then four bits of data from memory cell array B2-2, sensed by sense amplifiers SA21-1, SA21-2, SA22-1, SA22-2, are output onto respective data bus pairs DB2-1 and DBB2-1, DB2-2 and DBB2-2, DB2-3 and DBB2-3, and DB2-4 and DBB2-4, which have been precharged to the high logic level. Four more bits of data from memory cell array B2-6, sensed by corresponding sense amplifiers in sense amplifier arrays B2-5 and B2-7, are output simultaneously onto these same data bus lines. If, for example, identical data are output from memory cell arrays B2-2 and B2-6 onto data bus pair DB2-1, DBB2-1, then one data bus line, e.g., DB2-1, is pulled down by output amplifier-input buffers B2-10 and B2-14 while the other data bus line, e.g., DBB2-1, remains high, causing input-output buffer B2-20 to generate high output. If the output data from memory cell arrays B2-2 and B2-6 are not identical, however, then output amplifier-input buffer B2-10 pulls down one of the data bus lines, e.g. DB2-1, and output amplifier-input buffer B2-14 pulls down the other data bus line, e.g., DBB2-1, causing input-output buffer B2-20 to generate low output.

As in the first embodiment, eight bits are tested simultaneously, yielding four bits of external output that indicate whether respective pairs of bits match or not. When a non-matching pair of bits is found, however, the defective bit may be in either of two memory cell arrays, so it is not possible to tell which memory cell array to repair without conducting a further test.

Next, the redundancy repair circuitry in the first embodiment will be described.

Figure 4:
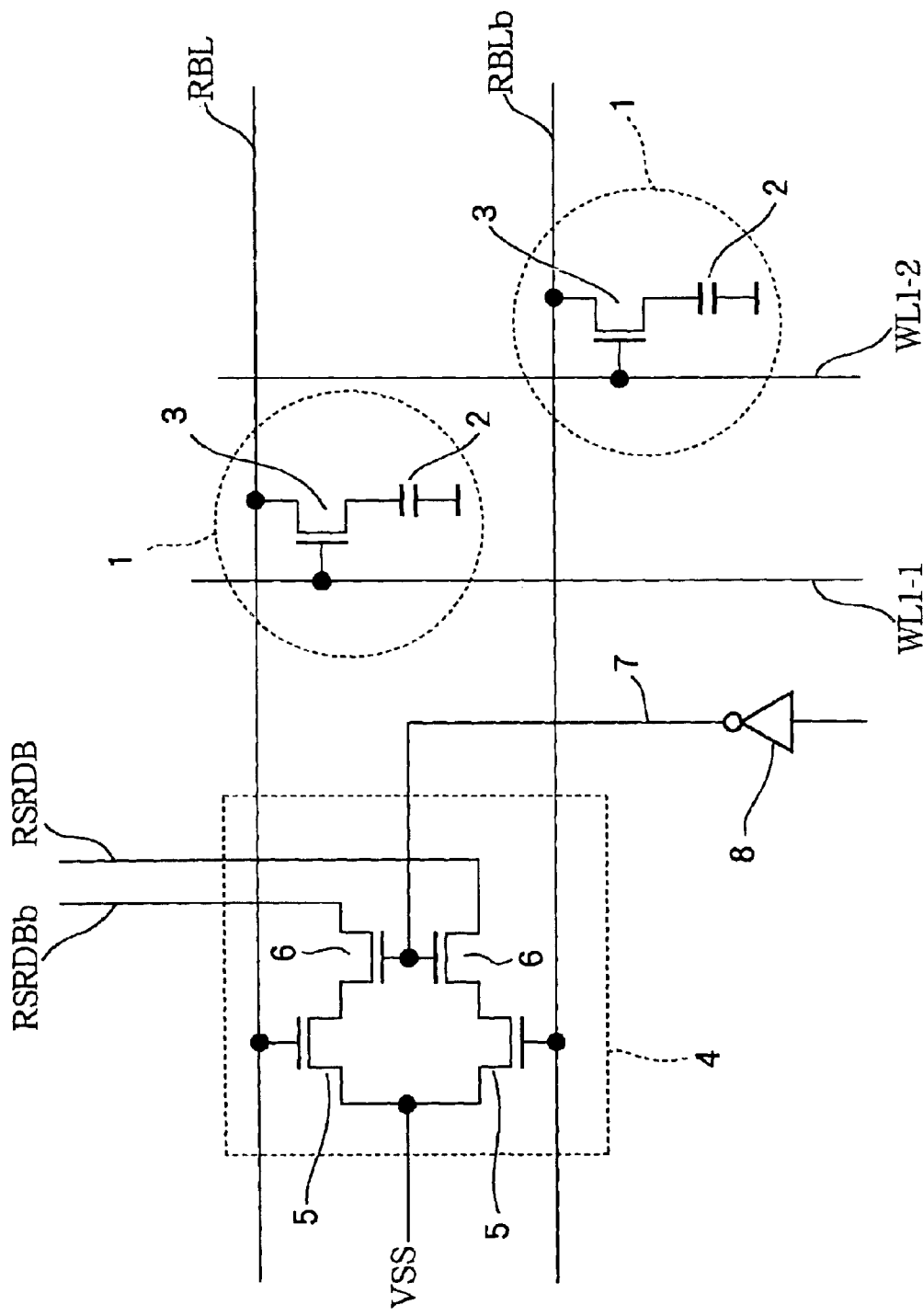
FIG. 4 is a circuit diagram illustrating a redundant sense amplifier, redundant bit lines, and redundant memory cells.

Referring to FIG. 4, each memory cell array is accompanied by a redundant memory cell array with at least one redundant column, including two pairs of redundant bit lines RBL, RBLb (only one pair is shown in FIG. 4) and their associated memory cells and sense amplifiers. A memory cell 1 comprises a capacitor 2 coupled through a switching transistor 3 to one of the bit lines. The gate electrode of the switching transistor 3 is coupled to one of the word lines, e.g., WL1-1 or WL1-2. A redundant sense amplifier 4 comprises a pair of NMOS sensing transistors 5 having source electrodes coupled to ground (VSS), gate electrodes coupled to respective bit lines RBL, RBLb, and drain electrodes coupled through respective switching transistors 6 to a pair of redundant read data bus lines RSRDB, RSRDBb. The switching transistors 6 are controlled by a redundancy selection signal output on a redundancy selection signal line 7 by an inverter 8.

The sense amplifiers in the sense amplifier arrays in FIGS. 1A and 1B have a similar structure, except that the gates of the switching transistors are coupled to a column line instead of a redundancy selection signal line 7. The dimensions of the transistors 5, 6 in the redundant sense amplifiers 4 may also differ from the dimensions of the transistors in the sense amplifiers in FIGS. 1A and 1B. Specifically, the transistors 5, 6 in the redundant sense amplifiers 4 may have longer or narrower channels than the transistors in the sense amplifiers in FIGS. 1A and 1B, in order to reduce their current-carrying capability to match the comparatively small load presented by the redundant read data bus lines RSRDB, RSRDBb, which are relatively short and are connected to fewer sense amplifiers than the read data bus lines SRDB1-1, SRDBb1-1 etc. in FIGS. 1A and 1B. If this dimensional adjustment is made, the redundant sense amplifiers 4 can produce the same potential difference on the redundant read data bus lines RSRDB, RSRDBb as the normal sense amplifiers SA11-1 etc. produce on the read data bus lines SRDB1-1, SRDBb1-1 etc. in FIGS. 1A and 1B.

Figure 5A:
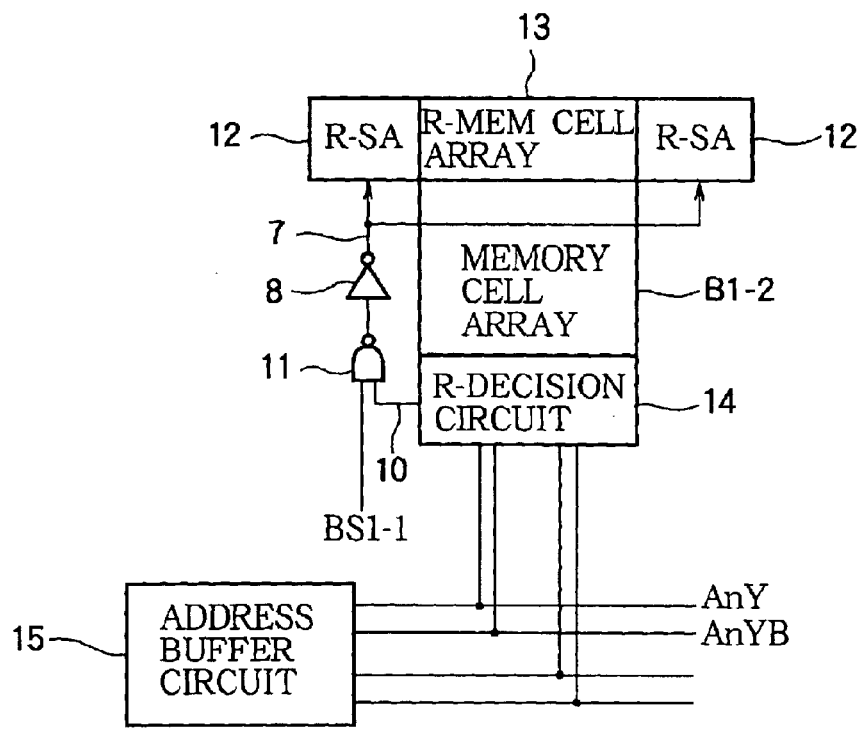
FIG. 5A is a block diagram illustrating a redundancy repair scheme applicable in the first embodiment.
Figure 5B:
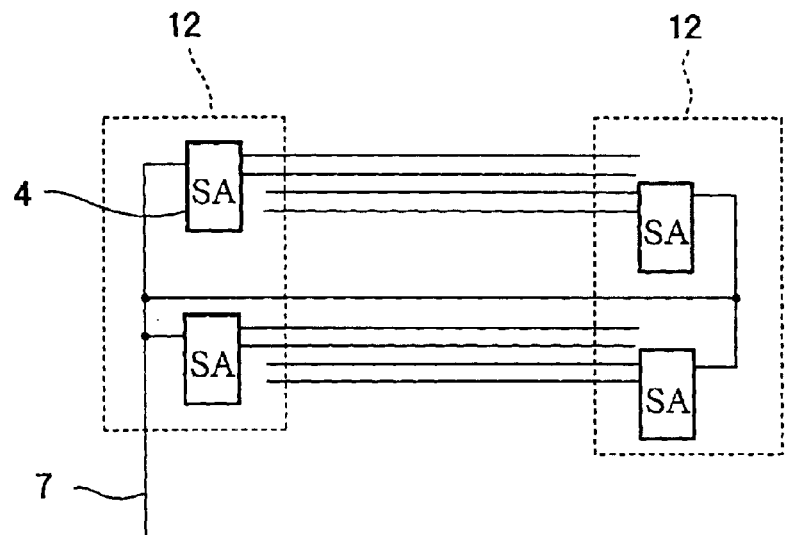
FIG. 5B is a circuit diagram illustrating the signal lines for selecting redundant sense amplifiers in FIG. 5A.

Referring to FIG. 5A, the redundancy selection signal for the first memory cell array B1-2, for example, is generated from the corresponding block select signal BS1-1 and a redundancy decision signal output on a redundancy decision signal line 10. These two signals are input to a NAND gate 11, the output terminal of which is connected to the input terminal of inverter 8. The redundancy selection signal line 7 leads from inverter 8 to a pair of redundant sense amplifier arrays (R-SA) 12, each having a pair of redundant sense amplifiers (SAs) 4 of the type shown in FIG. 4, connected as shown in FIG. 5B. These redundant sense amplifiers 4, together with the redundant bit lines and redundant memory cells in a redundant memory cell array (R-MEM CELL ARRAY) 13, form a redundant column that can replace the sense amplifiers and memory cells in an arbitrary column in the first two main sense amplifier arrays B1-1, B1-3 and the first memory cell array B1-2.

Figure 6:
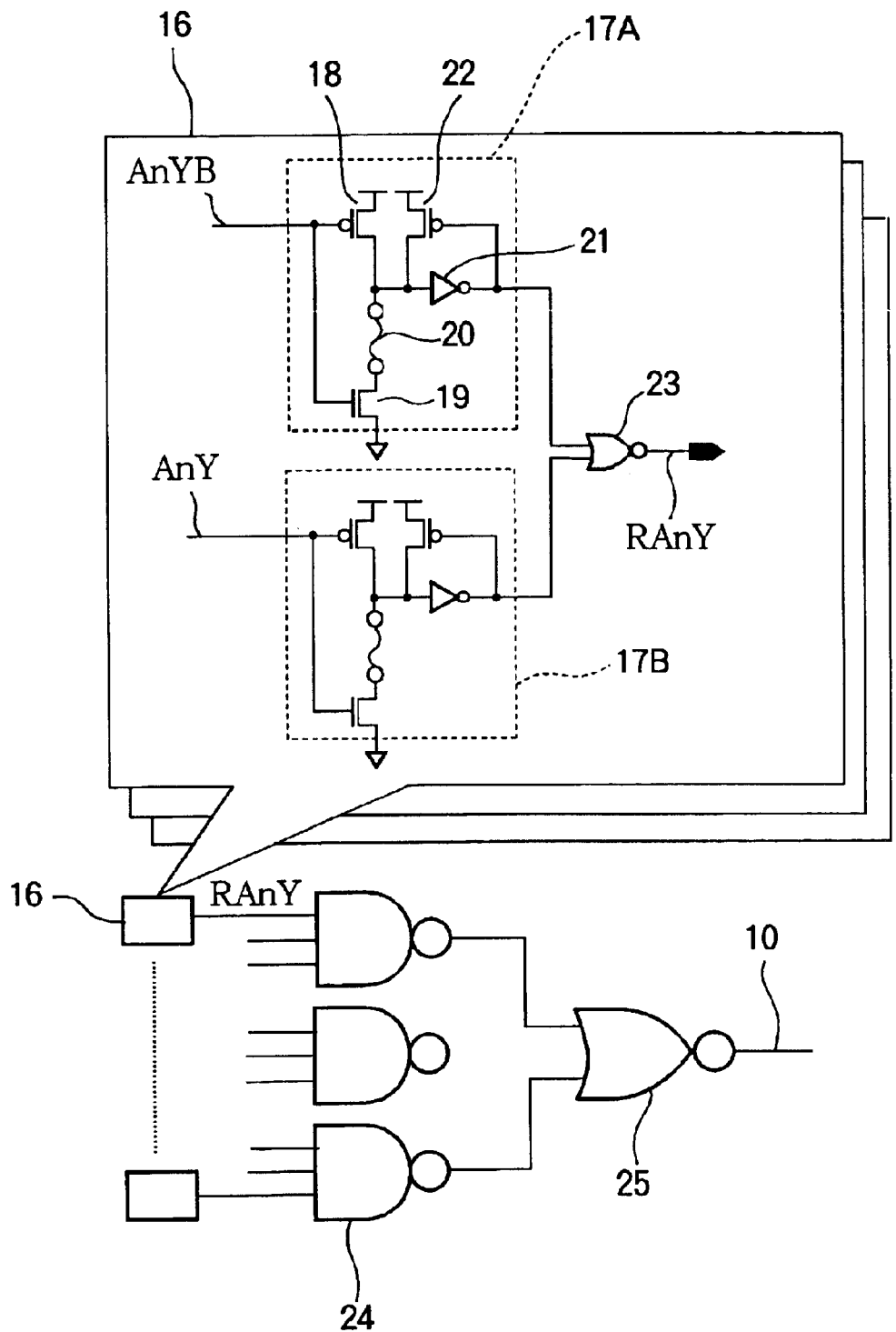
FIG. 6 is a circuit diagram of the redundancy decision circuit in FIG. 5A.

The redundancy decision signal is generated by a redundancy decision (R-DECISION) circuit 14 that receives complementary pairs of column address signals such as AnY and AnYB from an address buffer circuit 15. As shown in FIG. 6, the redundancy decision circuit 14 includes a plurality of fuse-programmable circuits 16. Each fuse-programmable circuit 16 has a pair of identical address bit processing circuits 17A, 17B, each comprising a PMOS transistor 18 and an NMOS transistor 19 coupled in series between the power supply and ground, their drain electrodes being interconnected by a fuse 20. A column address signal AnY is input to the gate electrodes of these transistors 18, 19 in one address bit processing circuit 17B; the complementary column address signal AnYB is input to the gate electrodes of these transistors 18, 19 in the other address bit processing circuit 17A. The drain of PMOS transistor 18 is connected to the input terminal of an inverter 21, the output terminal of which is connected to the gate electrode of a second PMOS transistor 22. The source electrode of PMOS transistor 22 is connected to the power supply; the drain electrode of PMOS transistor 22 is connected to the input terminal of inverter 21. The outputs of the inverters 21 in both address bit processing circuits 17A, 17B are also supplied to a NOR gate 23 that generates a redundancy address signal RAnY. The redundancy address signals from the fuse-programmable circuits 16 are supplied to NAND gates 24, the outputs of which are supplied to a NOR gate 25 that drives the redundancy decision signal line 10.

When the fuses 20 are intact, transistors 18 and 19 function as an inverter, so each address bit is inverted twice, then output to the NOR gate 23. Since AnY and AnYB are complementary, one of the inputs to NOR gate 23 is high, and the redundancy address signal RAnY is low. The output of the corresponding NAND gate 24 is therefore high, causing NOR gate 25 to drive the redundancy decision signal line 10 to the low logic level. The NAND gate 11 in FIG. 5A therefore generates a high output signal, and inverter 8 drives the redundancy selection signal line 7 low, disabling the corresponding redundant sense amplifiers 4 in FIGS. 4 and 5B.

When a low output is produced in the test output mode described above, the address of the defective column is programmed into the fuse-programmable circuits 16 in the redundancy decision circuit 14 of the corresponding memory cell array. If column address signal AnY is low and AnYB is high at the defective address, then the fuse 20 in address bit processing circuit 17A is cut by, for example, exposure to a pulse of laser light. If column address signal AnY is high and AnYB is low at the defective address, then the fuse in address bit processing circuit 17B is cut.

If the fuse 20 in address bit processing circuit 17A has been cut, then during operation, the first time address signal AnYB goes low, turning on PMOS transistor 18 in address bit processing circuit 17A, PMOS transistor 22 is also turned on by the low output of inverter 21. Thereafter, PMOS transistor 22 remains turned on, pulling up the input terminal of inverter 21 to the power supply level, so that the output of inverter 21 remains low. When address signal AnY is low, accordingly, both inputs to the NOR gate 23 are low and the redundancy address signal RAnY goes high. When all column address bits match the defective address, the outputs of all NAND gates 24 go low, and NOR gate 25 drives the redundancy decision signal line 10 to the high logic level. If the corresponding block select signal is also high, then the NAND gate 11 and inverter 8 in FIG. 5A drive the redundancy selection signal line 7 high, enabling the redundant sense amplifiers in FIGS. 4 and 5B.

Figure 7A:
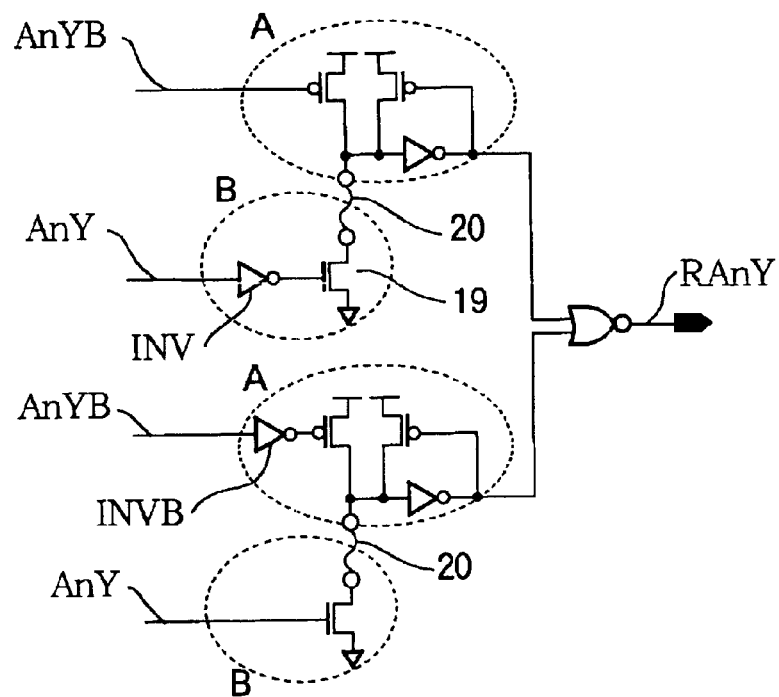
FIGS. 7A and 7B illustrate a modification of the circuitry shown in FIG. 6.
Figure 7B:
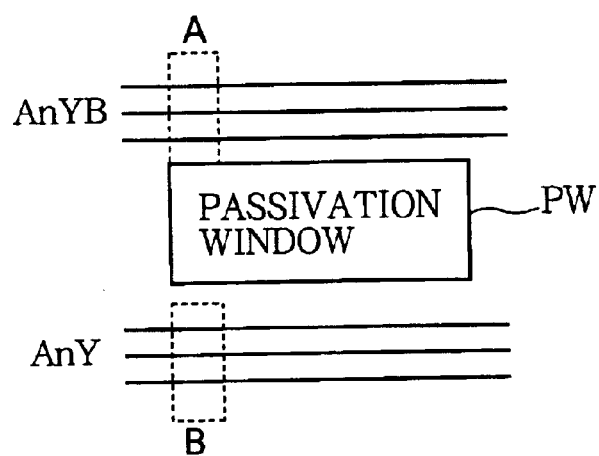

FIGS. 7A and 7B show a modification of the circuitry in FIG. 6. An additional inverter INV is provided to invert column address signal AnY, and the resulting inverted address signal is input in place of address signal AnYB to the gate of NMOS transistor 19. A similar inverter INVB is provided to invert address signal AnYB for input to the gate electrode of the PMOS transistor that received address signal AnY in FIG. 6. These inverters enable the circuit layout shown in FIG. 7B, in which both fuses 20 are disposed in a single window PW in the passivation layer that protects the metal wiring of the semiconductor memory device. The circuitry marked A in FIG. 7A is disposed above the passivation window PW in the area marked A in FIG. 7B, and the circuitry marked B in FIG. 7A is disposed below the passivation window PW in the area marked B in FIG. 7B. It then suffices to route a single address signal line AnYB above the passivation window PW and another single address signal line AnYB below the passivation window PW.

It is not possible to route metal address signal lines through the passivation window PW, which must be kept clear to enable the fuses 20 to be cut by laser light. The circuit in FIG. 6 would require AnY address signal lines both above and below the passivation window (and AnYB address signal lines both above and below the passivation window). The transistors connected to an address signal line are laid out directly below the address signal line, so the area occupied by circuits A and B in FIG. 7A is determined mainly by the number of address signal lines to which they must be connected. The scheme in FIGS. 7A and 7B reduces the necessary number of address signal lines by half, enabling the size of the semiconductor memory device to be reduced correspondingly.

Since the comparison results output in the test output mode isolate defective bits to a particular column in a particular memory cell array, the programming of the redundancy decision circuits 14 can proceed without the need for further tests to decide which memory cell array needs repair. The time necessary for redundancy repair is therefore shortened, and the cost of redundancy repair is correspondingly reduced.

The circuits shown in FIGS. 4, 5A, 5B, 6, 7A, and 7B make it possible to repair one column in each memory cell array by replacing the column with a redundant column. Defects in different columns in different memory cell arrays can be repaired simultaneously, even if each redundant memory cell array has only a single column of memory cells. If necessary, additional redundant sense amplifiers, bit lines, and memory cells can be provided in the redundant sense amplifier arrays 12 and redundant memory cell arrays 13, and additional redundancy decision circuits 14 can be provided, so that defects in different columns in the same memory cell array can be repaired.

Figure 8A:
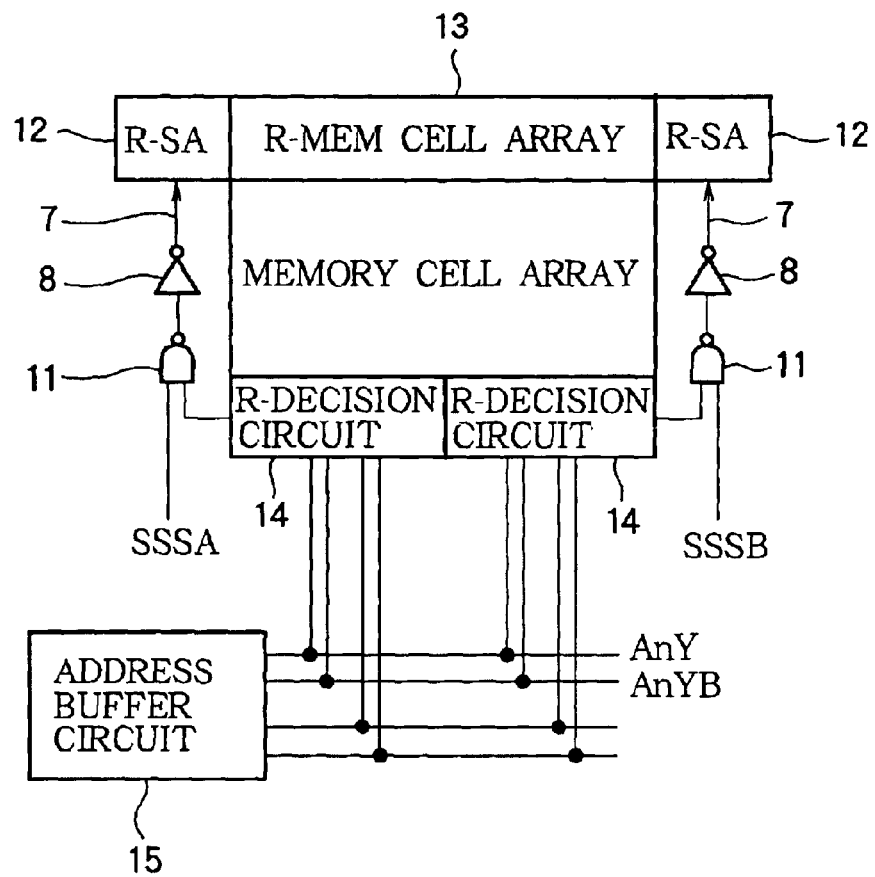
FIG. 8A is a block diagram illustrating another redundancy repair scheme applicable in the first embodiment.
Figure 8B:
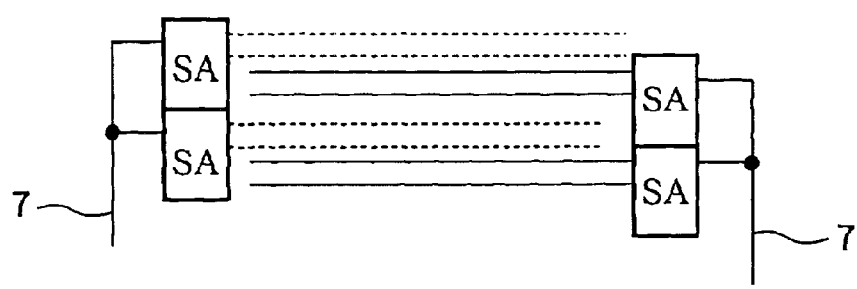
FIG. 8B is a circuit diagram illustrating the signal lines for selecting redundant sense amplifiers in FIG. 8A.

FIGS. 8A and 8B show another way to increase the number of defective bits that can be repaired. FIG. 8A is similar to FIG. 5A, except that a separate inverter 8 and NAND gate 11 and are provided for each redundant sense amplifier array 12. Instead of receiving a block select signal, each NAND gate 10 receives a sense amplifier array select signal (SSSA or SSSB). Instead of a single redundancy decision circuit 14, two redundancy decision circuits 14 are provided, each having the structure shown in FIG. 6, one serving the left redundant sense amplifier array 12 and one serving the right redundant sense amplifier array 12. As shown in FIG. 8B, each redundancy selection signal line 7 selects only two sense amplifiers (SAs). This arrangement enables two defective bits in different columns in the same memory cell array to be repaired, provided the two bits are coupled to sense amplifiers in different sense amplifier arrays.

If the redundant sense amplifier array disposed between two adjacent redundant memory cell arrays reads data from both redundant memory cell arrays, the sense amplifier array select signals SSSA, SSSB may be generated by simple logic circuits (not shown) that operate on the block select signals. If each redundant sense amplifier array reads data from only a single redundant memory cell array (as shown in FIGS. 5B and 7B), the block select signals may be used as sense amplifier array select signals.

Figure 9:
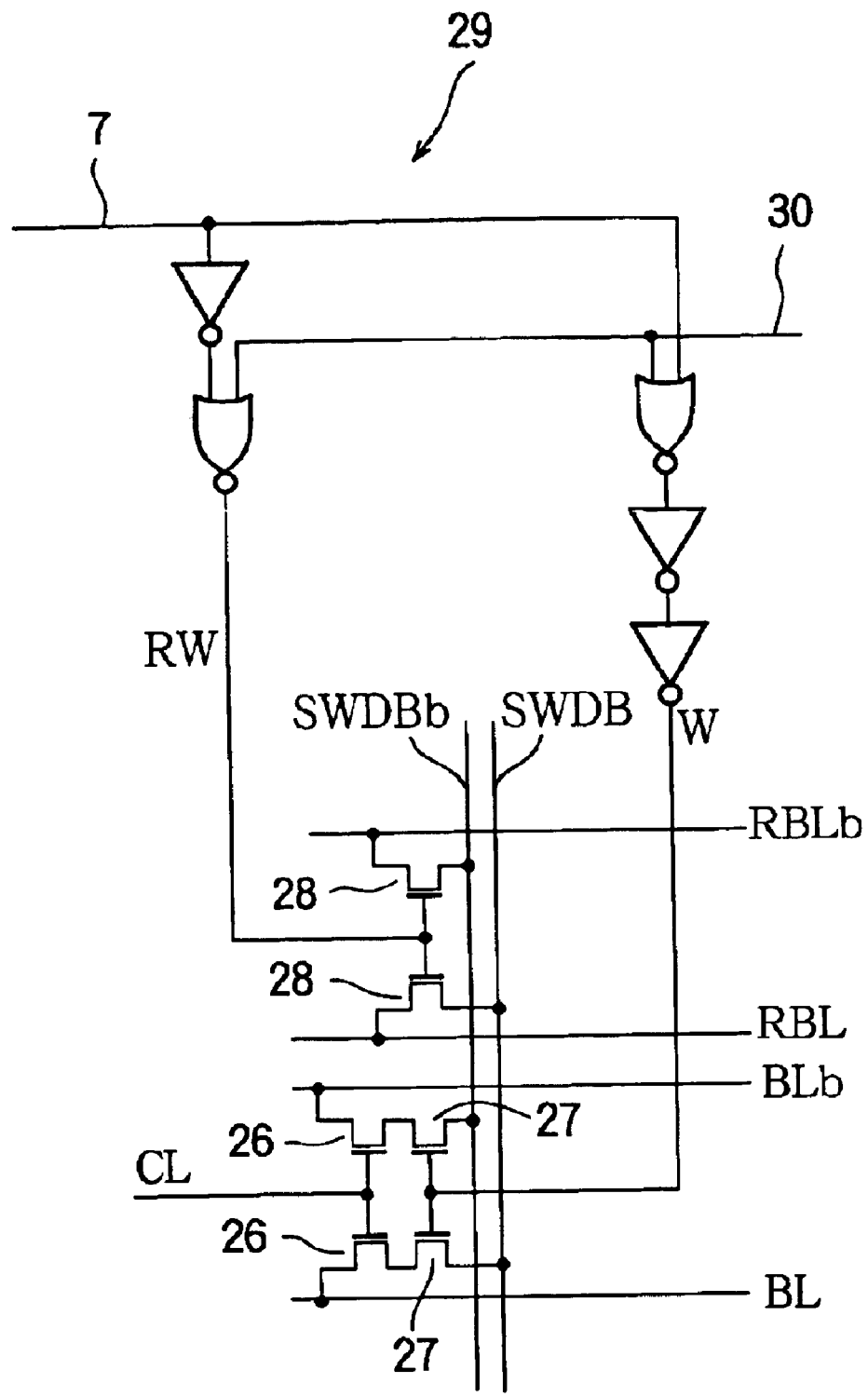
FIG. 9 is a circuit diagram illustrating the connection of write data bus lines to sense amplifiers and redundant sense amplifiers.

When a redundancy repair is performed it is also necessary to redirect write access to the redundant memory cells. As shown in FIG. 9, the write data bus lines SWDB and SWDBb from an output amplifier-input buffer are coupled to bit lines BL and BLb in the corresponding main memory cell array through a pair of switching transistors 26 controlled by a column signal CL and a pair of switching transistors 27 controlled by a write signal W, these pairs of switching transistors 26, 27 being disposed in one of the sense amplifier arrays. The same write data bus lines SWDB and SWDBb are also coupled by redundant switching transistors 28 in a redundant sense amplifier array to a pair of redundant bit lines RBL, RBLb in the corresponding redundant memory cell array. The redundant switching transistors 28 are controlled by a redundant write signal RW. The write signal W and redundant write signal RW are generated by a circuit 29 comprising NOR gates and inverters connected to the redundancy selection signal line 7 and a write enable signal line 30. The write signal W is activated (driven high) when the write enable signal is active (high) and the redundancy selection signal is inactive (low). The redundant write signal RW is activated when the write enable signal and redundancy selection signal are both active. This arrangement avoids the need for redundant write data bus lines, thereby reducing the number of signal lines necessary in the sense amplifier arrays and enabling the size of the semiconductor memory device to be reduced.

Figure 10:
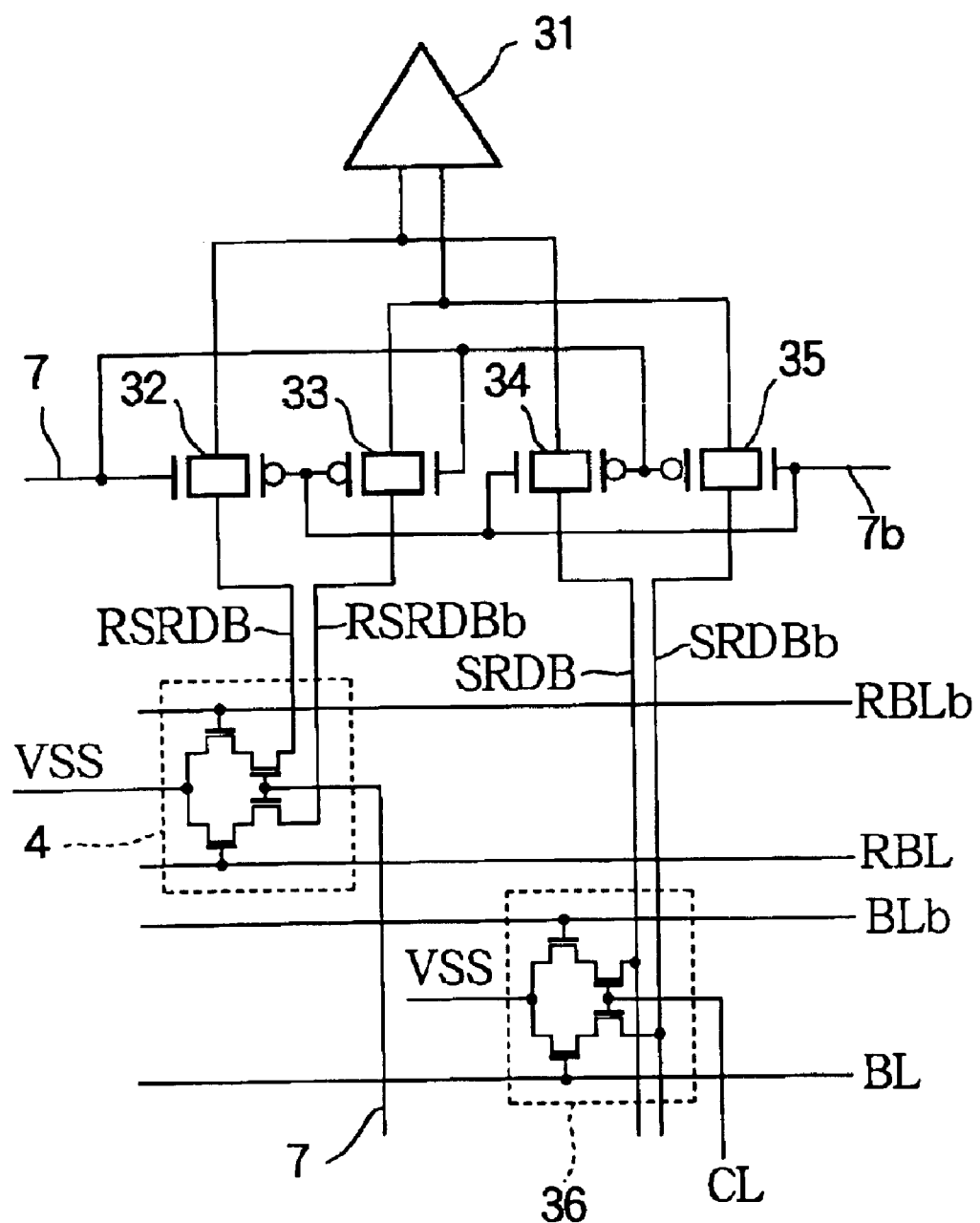
FIG. 10 is a circuit diagram illustrating the connection of sense amplifiers and redundant sense amplifiers to a read amplifier in an output amplifier-input buffer in FIGS. 1A and 1B.

Referring to FIG. 10, the read amplifier 31 in each output amplifier-input buffer is coupled through transmission gates 32, 33, 34, 35 to both the read data bus lines SRDB, SRDBb in the corresponding sense amplifier array and a pair of redundant read data bus lines RSRDB, RSRDBb in the corresponding redundant sense amplifier array. The transmission gates 32, 33, 34, 35 are controlled by the redundancy selection signal line 7 and a complementary redundancy selection signal line 7b. When the redundancy selection signal line 7 is at the low (inactive) level and the complementary redundancy selection signal line 7b is at the high (inactive) level, transmission gates 32, 33 are switched off and transmission gates 34, 35 are switched on so that the data sensed by the sense amplifiers 36 in the sense amplifier array can be read. When the redundancy selection signal line 7 is at the high (active) level and the complementary redundancy selection signal line 7b is at the low (active) level, transmission gates 32, 33 are switched on and transmission gates 34, 35 are switched off so that the data sensed by the redundant sense amplifiers 4 can be read. This arrangement avoids the need for redundant read amplifiers, thereby reducing the size of the output amplifier-input buffers and enabling the size of the semiconductor memory device to be reduced.

Figure 11:
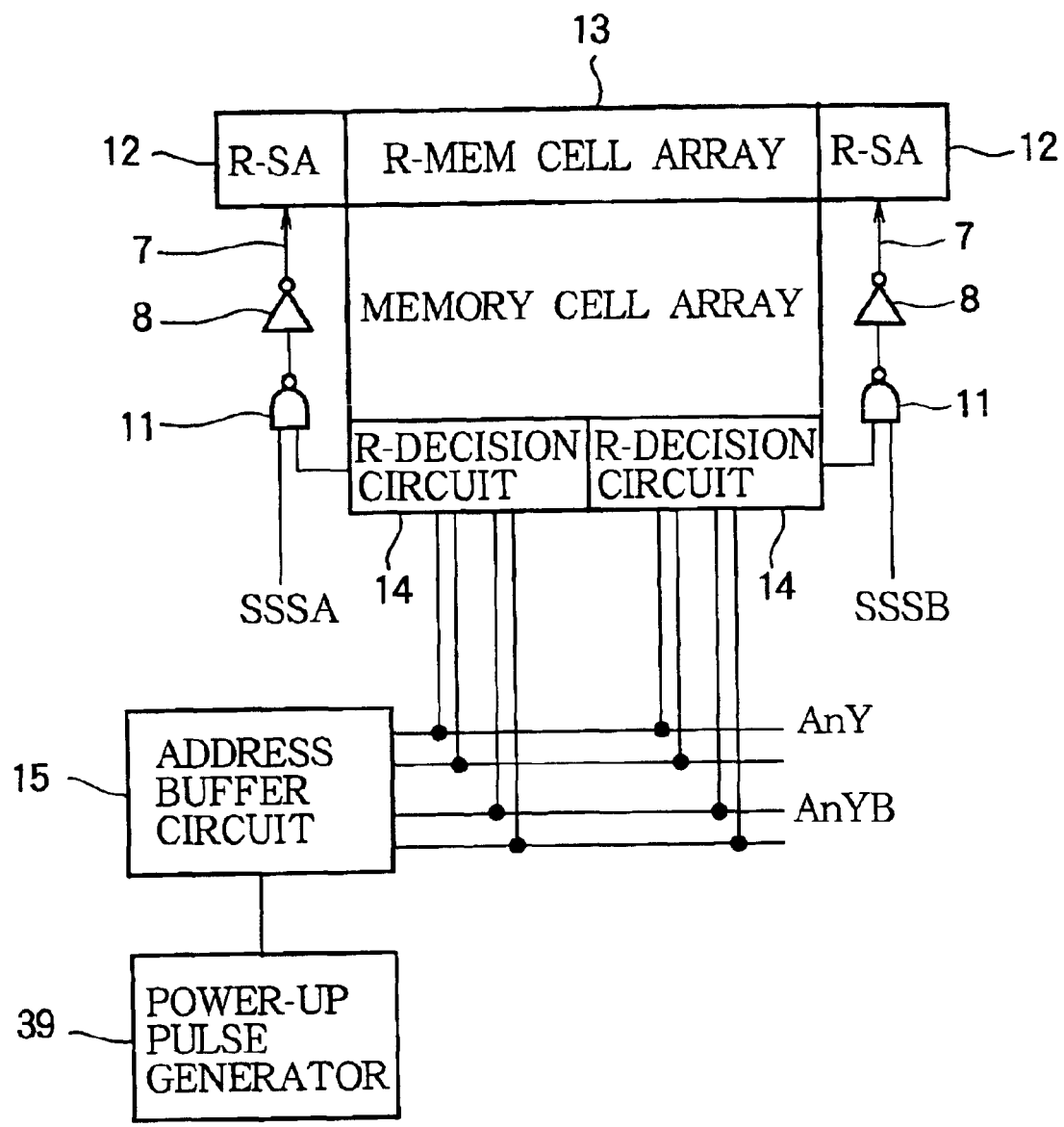
FIG. 11 is a block diagram illustrating a variation of the redundancy repair scheme in FIG. 8A.

Referring to FIG. 11, the first embodiment may include a power-up pulse generator 39 that outputs a one-shot pulse on each column address signal line in the address buffer circuit 15 when the power supply of the semiconductor memory device is switched on. This pulse temporarily inverts each column address signal output from the address buffer circuit 15: for example, column address signal AnY may go high, then low, while address signal AnYB goes low, then high. As a result, if the fuse 20 in address bit processing circuit 17A in FIG. 6, for example, has been cut, PMOS transistors 18 and 22 turn on when address signal AnYB goes low. PMOS transistor 22 remains turned on thereafter, enabling redundancy address signal RAnY to go high when an input address matches the defective address programmed into the redundancy decision circuit 14.

If a fuse 20 is cut, the output of the corresponding address bit processing circuit 17A or 17B remains indeterminate until the corresponding address signal goes low. The power-up pulse generator 39 assures that no address bit processing circuits are left in this indeterminate state during normal operation, so that if a redundancy repair has been performed, the redundant memory cells are accessible at even the first memory access.

Figure 12:
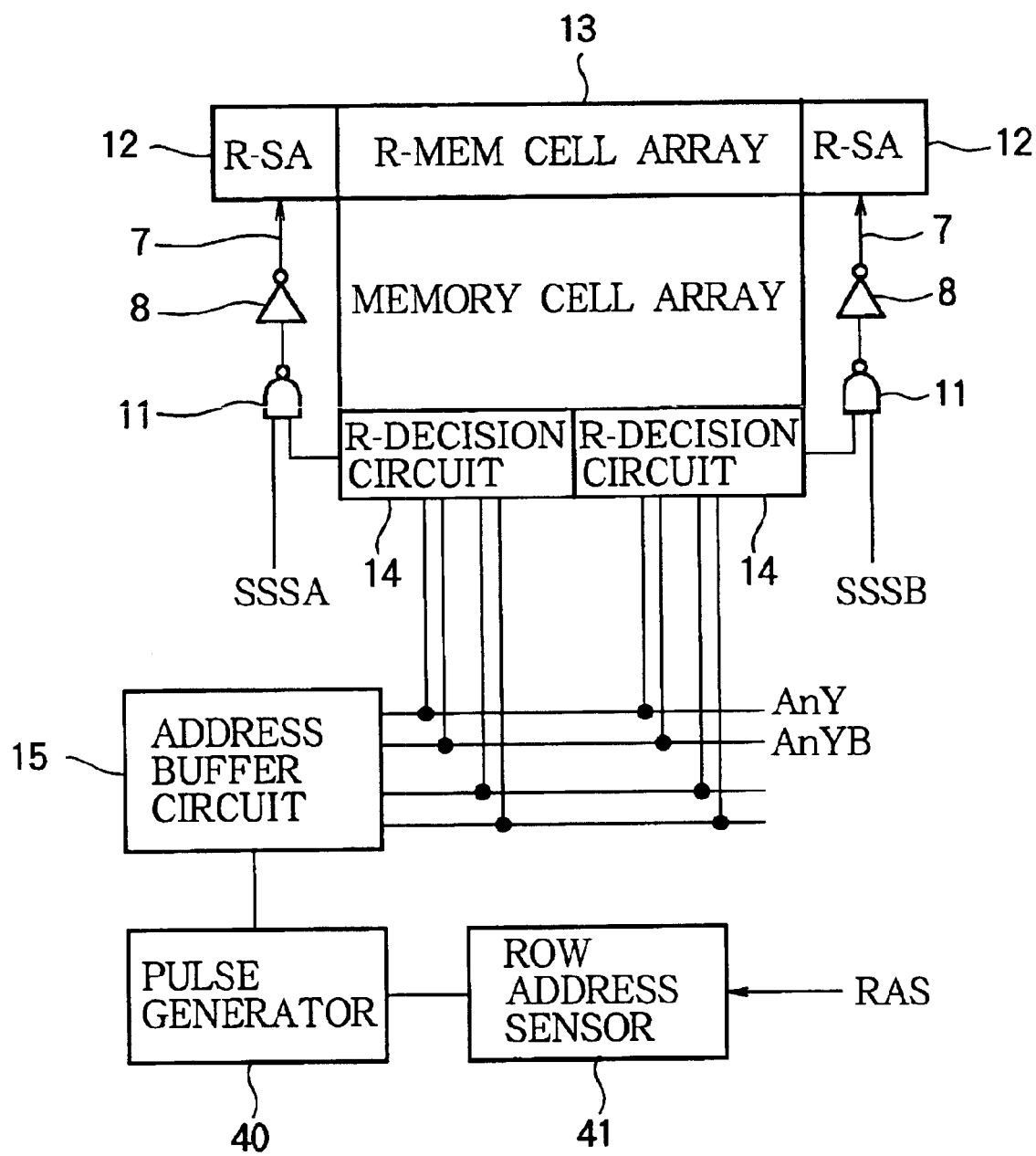
FIG. 12 is a block diagram illustrating a further variation of the redundancy repair scheme in FIG. 8A.

Referring to FIG. 12, instead of a power-up pulse generator, the first embodiment may include a pulse generator 40 and a row address sensor 41. The row address sensor 41 responds to input of a row address strobe (RAS) signal to the semiconductor memory device by activating the pulse generator 40. The pulse generator 40 then outputs a one-shot pulse that inverts each column address signal as described above, assuring that there are no address bit processing circuits with indeterminate output at the beginning of each RAS cycle. This scheme enhances the robustness of the semiconductor memory device with respect to electrical noise and other disturbances that may occur during operation.

The first embodiment enables defective bits to be detected and isolated to a particular memory cell array and a particular sense amplifier array in a single high-speed test, in which eight bits are tested at once instead of just four. This single test provides all the address information needed for redundancy repair. Moreover, since the test compares bits sensed by two sense amplifiers in the same sense amplifier array, if one of the two bits is defective, the defect can be repaired by replacing only those two sense amplifiers, enabling defects in up to two columns per memory cell array to be repaired by a single redundant column of sense amplifiers, bit lines, and memory cells.

Although the first embodiment requires extra test data bus lines, there is no layout space penalty, because these test data bus lines are used as shield lines during normal operation. Since the test data bus lines do not operate simultaneously with the data bus lines, capacitive coupling between the data bus lines and test data bus lines does not cause problems of crosstalk or signal delay.

Using separate test data bus lines for output of the test results also reduces the capacitive load on the normal data bus lines, by reducing the number of circuit elements connected to the data bus lines. The data bus lines do not have to be connected to the decision circuits, for example. Signal propagation delays on the data bus signal lines during normal operation are reduced accordingly.

Second Embodiment

Figure 13A:
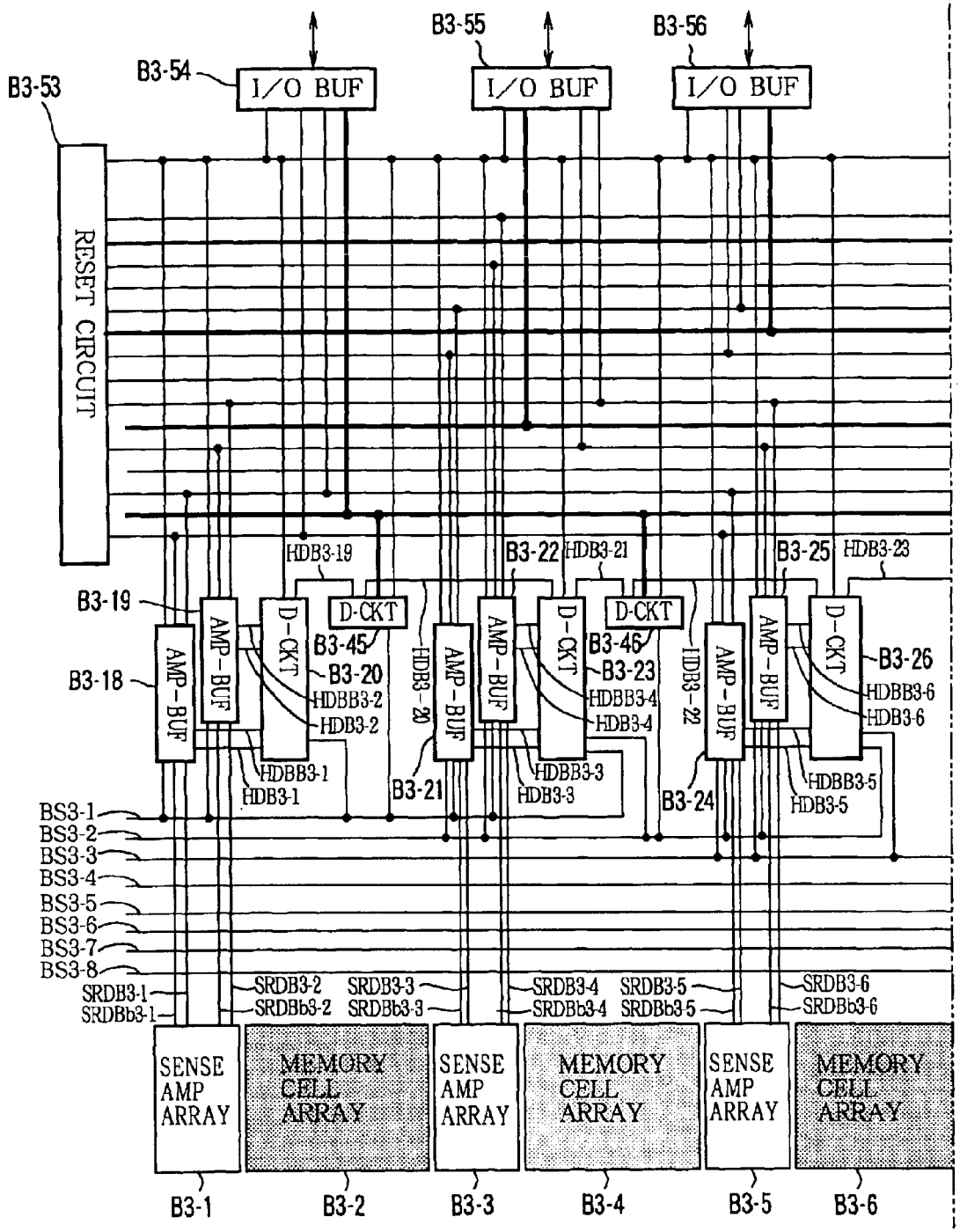
FIG. 13, consisting of FIGS. 13A, 13B, and 13C, is a block diagram of a semiconductor memory device illustrating a second embodiment of the invention.
Figure 13B:
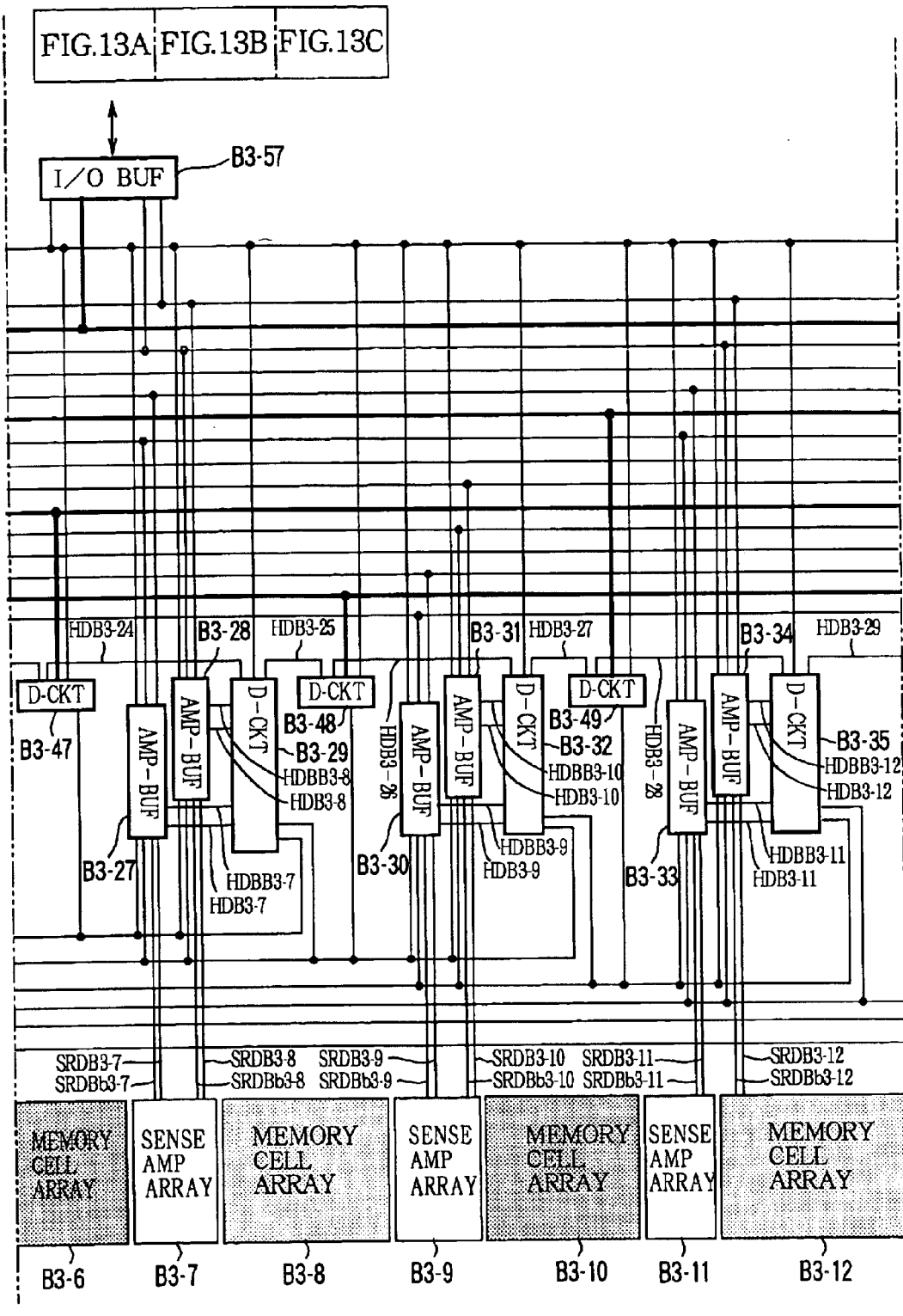
Figure 13C:
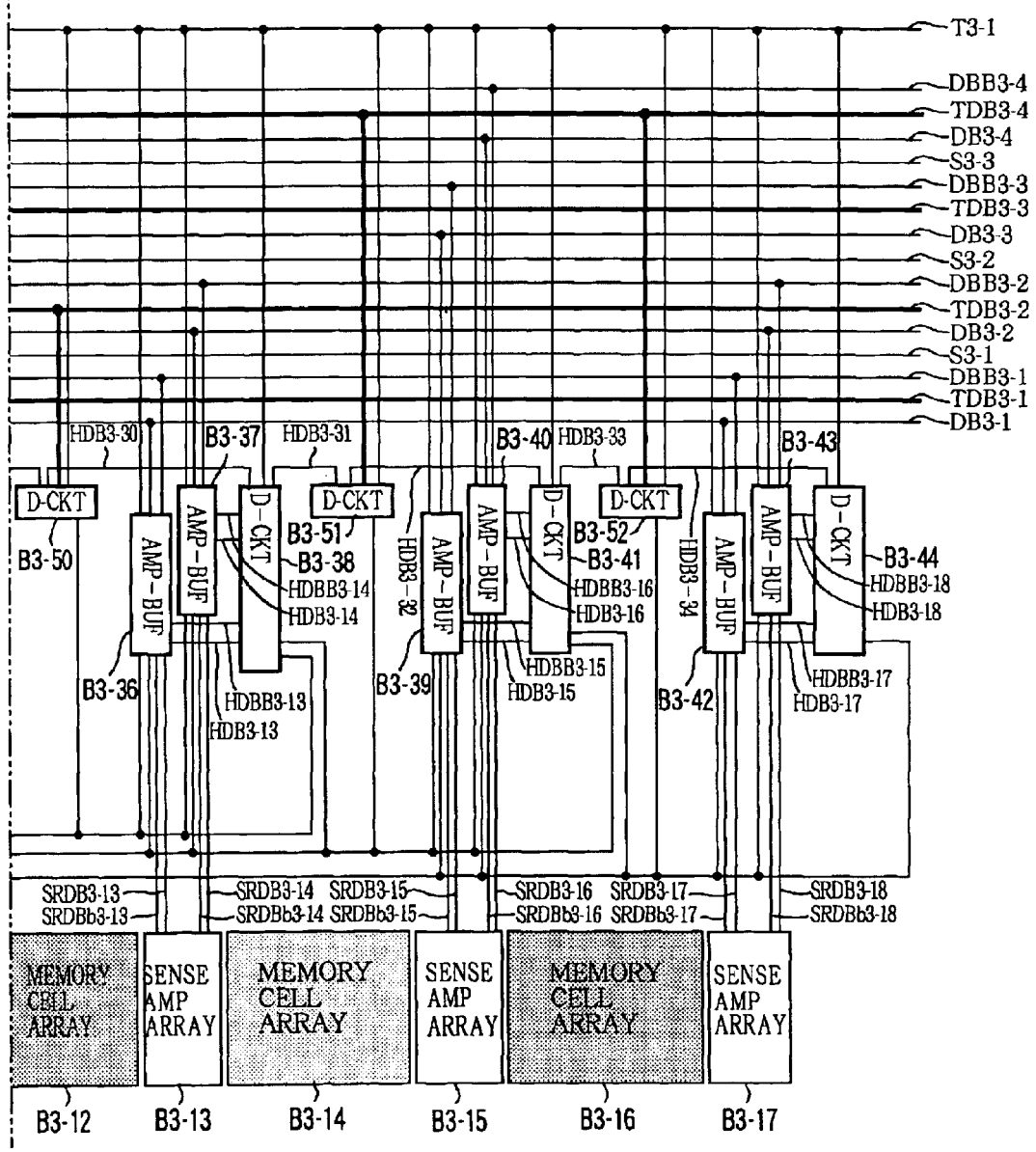

Referring to FIGS. 13A, 13B, and 13C, the second embodiment is generally similar to the first embodiment but has twice as many memory cell arrays, and tests twice as many bits at once. Specifically, the second embodiment has eight memory cell arrays B3-2, B3-4, B3-6, B3-8, B3-10, B3-12, B3-14, B3-16 interspersed among nine sense amplifier arrays B3-1, B3-3, B3-5, B3-7, B3-9, B3-11, B3-13, B3-15, B3-17. The sense amplifier arrays are connected by complementary pairs of read data bus lines SRDB3-1, SRDBb3-1, . . . , SRDB3-18, SRDBb3-18 to output amplifier-input buffers B3-18, B3-19, B3-21, B3-22, B3-24, B3-25, B3-27, B3-28, B3-30, B3-31, B3-33, B3-34, B3-36, B3-37, B3-39, B3-40, B3-42, B3-43 which provide amplified read data to primary decision circuits B3-20, B3-23, B3-26, B3-29, B3-32, B3-35, B3-38, B3-41, B3-44 via comparison data buses HDB3-1, HDBB3-1, . . . , HDB3-18, HDBB3-18, as described in the first embodiment.

The comparison results obtained by each adjacent pair of primary decision circuits are routed through further comparison data bus lines to a secondary decision circuit. Specifically, primary decision circuits B3-20 and B3-23 are connected by comparison data bus lines HDB3-19, HDB3-20 to secondary decision circuit B3-45; primary decision circuits B3-23 and B3-26 are connected by comparison data bus lines HDB3-21, HDB3-22 to secondary decision circuit B3-46; primary decision circuits B3-26 and B3-29 are connected by comparison data bus lines HDB3-23, HDB3-24 to secondary decision circuit B3-47; primary decision circuits B3-29 and B3-32 are connected by comparison data bus lines HDB3-25, HDB3-26 to secondary decision circuit B3-48; primary decision circuits B3-32 and B3-35 are connected by comparison data bus lines HDB3-27, HDB3-28 to secondary decision circuit B3-49; primary decision circuits B3-35 and B3-38 are connected by comparison data bus lines HDB3-29, HDB3-30 to secondary decision circuit B3-50; primary decision circuits B3-38 and B3-41 are connected by comparison data bus lines HDB3-31, HDB3-32 to secondary decision circuit B3-51; and primary decision circuits B3-41 and B3-44 are connected by comparison data bus lines HDB3-33, HDB3-34 to secondary decision circuit B3-52.

The first two secondary decision circuits B3-45, B3-46 are connected to test data bus line TDB3-1, which is disposed between data bus lines DB3-1 and DBB3-1; the next two secondary decision circuits B3-47, B3-48 are connected to test data bus line TDB3-2, which is disposed between data bus lines DB3-2 and DBB3-2; the next two secondary decision circuits B3-49 and B3-50 are connected to test data bus line TDB3-3, which is disposed between data bus lines DB3-3 and DBB3-3; and the last two secondary decision circuits B3-51, B3-52 are connected to test data bus line TDB3-4, which is disposed between data bus lines DB3-4 and DBB3-4. Shield lines S3-1 to S3-3 are provided between data bus lines DBB3-1 and DB3-2, DBB3-2 and DB3-3, and DBB3-3 and DB3-4. The data buses and test data buses are connected to a reset circuit B3-53 as in the first embodiment.

The complementary pairs of data bus lines are connected in essentially the same way as in the first embodiment: data bus lines DB3-1 and DBB3-1 to output amplifier-input buffers B3-18, B3-24, B3-30, B3-36, B3-42 and input-output buffer B3-54; data bus lines DB3-2 and DBB3-2 to output amplifier-input buffers B3-19, B3-25, B3-31, B3-37, B3-43 and input-output buffer B3-55; data bus lines DB3-3 and DBB3-3 to output amplifier-input buffers B3-21, B3-27, B3-33, B3-39 and input-output buffer B3-56; and data bus lines DB3-4 and DBB3-4 to output amplifier-input buffers B3-22, B3-28, B3-34, B3-40 and input-output buffer B3-57. A test control signal line T3-1 is connected to all the output amplifier-input buffers, primary decision circuits, and input-output buffers, and to the reset circuit B3-53.

In the second embodiment there are eight block select lines BS3-1 to BS3-8, each selecting the four output amplifier-input buffers, two primary decision circuits, and one secondary decision circuit associated with one memory cell array. For example, block select signal BS3-1 selects the output amplifier-input buffers B3-18, B3-19, B3-21, B3-22, primary decision circuits B3-20, B3-23, and secondary decision circuit B3-45 associated with the first memory cell array B3-2.

Figure 14:
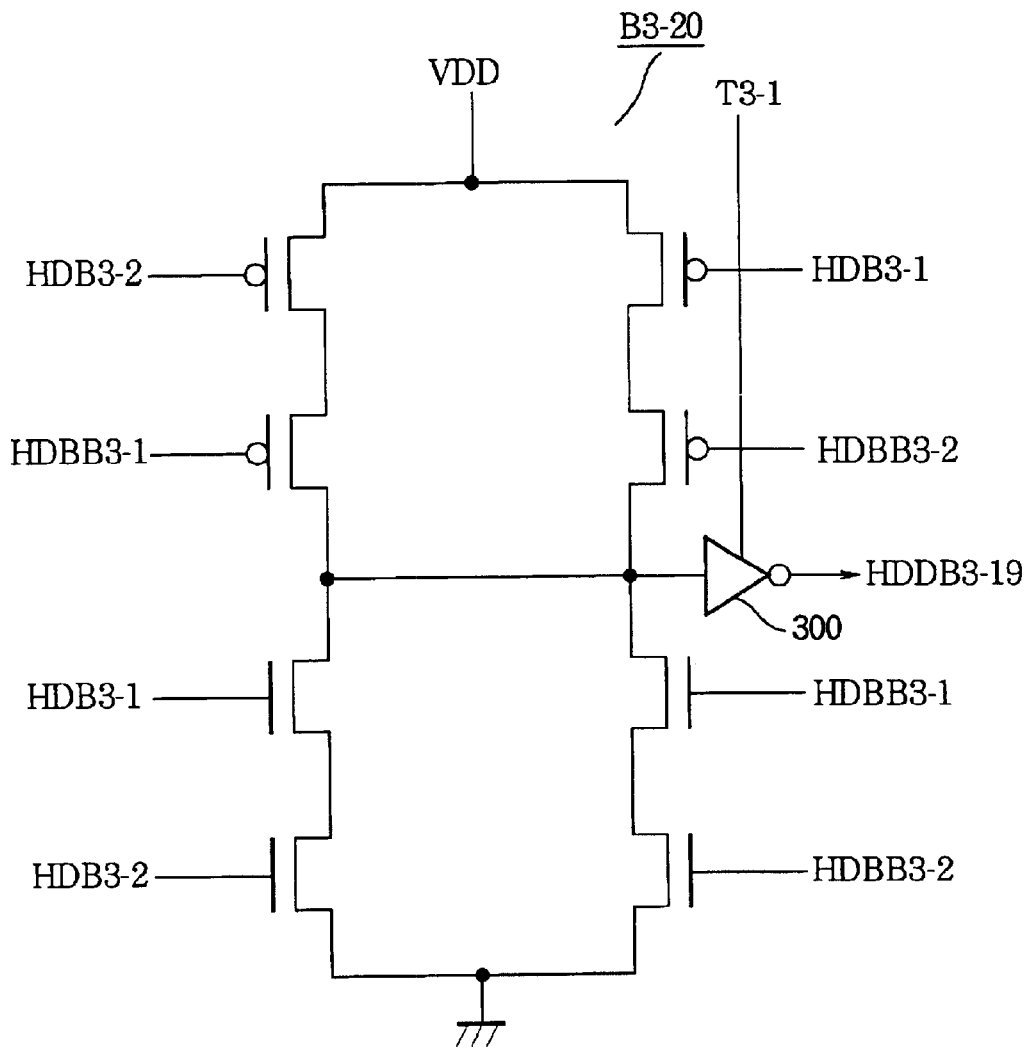
FIG. 14 is a circuit diagram illustrating the internal structure of the primary decision circuits in FIGS. 13A, 13B, and 13C.

Referring to FIG. 14, the primary decision circuits (e.g., B3-20) have the same internal structure as the decision circuits in the first embodiment, except that instead of driving the test data buses, they drive comparison data bus lines (e.g., HDB3-19) leading to the secondary decision circuits, and when the test control signal T3-1 is inactive (low), the output of the inverter 300 is held at the high logic level.

Figure 15:
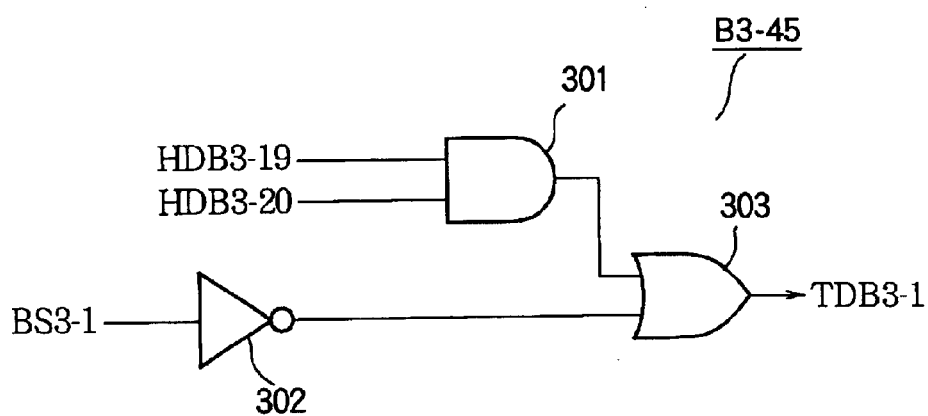
FIG. 15 is a circuit diagram illustrating the internal structure of the secondary decision circuits in FIGS. 13A, 13B, and 13C.

Referring to FIG. 15, the first secondary decision circuit B3-45 comprises an AND gate 301 with input terminals connected to comparison data bus lines HDB3-19 and HDB3-20, an inverter 302 that inverts block select signal BS3-1, and an OR gate 303 that receives the outputs of the AND gate 301 and inverter 302 and drives test data bus line TDB3-1. The transistors (not shown) in the OR gate 303 are sized so that the pull-down (low) driving capability of the OR gate 303 is significantly greater than its pull-up (high) driving capability.

The other secondary decision circuits have a similar structure.

During normal read and write access, the test control signal T3-1 is inactive (low), the output amplifier-input buffers are connected to the data bus lines, the decision circuits are disabled, and the input-output buffers transfer data between the data bus lines and the external data terminals. One of the block select signals is activated, and one memory cell array is accessed as described in the first embodiment.

To conduct a test, identical data are written into the memory cells in all eight memory cell arrays thirty-two bits at a time, by activating all eight block select signals. Next, the test control signal T3-1 is activated (driven high), disconnecting the output amplifier-input buffers from the data bus lines, enabling the primary decision circuits, and causing the input-output buffers to output data obtained from the test data bus lines. Four of the block select signals are activated to test sixteen bits, disposed in four memory cell arrays, at once. In the following description, it will be assumed that the odd-numbered block signal lines BS3-1, BS3-3, BS3-5, BS3-7 are activated to test data in memory cell arrays B3-2, B3-6, B3-10, and B3-14. Before each sixteen bits are read, the reset circuit B3-53 precharges the test data bus lines to the high level.

If the four bits read from memory cell array B3-2 have the expected values (identically '1' or identically '0'), primary decision circuits B3-20 and B3-23 generate high output signals as explained in the first embodiment. Secondary decision circuit B3-45 leaves test data bus line TDB3-1 at the high level because both inputs to AND gate 301 are high, making the output of AND gate 301 and thus the output of OR gate 303 high. Secondary decision circuit B3-46 also leaves this test data bus line TDB3-1 at the high level, because block select signal BS3-2 is inactive (low). Input-output buffer B3-54 therefore generates a high output signal, indicating that the four bits read from memory cell array B3-2 are normal.

If one of the four bits read from memory cell array B3-2 has the incorrect value, then primary decision circuit B3-20 or B3-23 generates a low output signal as explained in the first embodiment. Secondary decision circuit B3-45 pulls test data bus line TDB3-1 down to the low level because one of the inputs to AND gate 301 in FIG. 15 is low, and the output of inverter 302 is also low, making the output of OR gate 303 low. Although the OR gate in secondary decision circuit B3-46 still generates a high output signal, its pull-up driving capability is less than the pull-down driving capability of the OR gate in secondary decision circuit B3-45. Test data bus line TDB3-1 is therefore pulled down to a sufficiently low level to cause input-output buffer B3-54 to generate a low output signal, indicating that one of the four bits read from memory cell array B3-2 is defective.

Defective bits (if any) in memory cell arrays B3-6, B3-10, and B3-14 are indicated in like manner by the outputs of input-output buffers B3-55 to B3-57, the single bit output from each input-output buffer giving a test result for four memory cells. Memory cell arrays B3-4, B3-8, B3-12, and B3-16 are tested in like manner by leaving the odd-numbered block select lines are inactive and activating the even-numbered block select lines BS3-2, BS3-4, BS3-6, BS3-8.

When a defect is found in, for example, memory cell array B3-2, the corresponding column of sense amplifiers, bit lines, and memory cells in memory cell array B3-2 and sense amplifier arrays B3-1 and B3-3 is replaced with a redundant column by the scheme illustrated in FIGS. 5A and 5B in the first embodiment. That is, four sense amplifiers, four complementary pairs of bit lines, and their attached memory cells are replaced with redundant sense amplifiers, bit lines, and memory cells. The scheme illustrated in FIGS. 8A and 8B is not used, because it is not known whether the defective bit was sensed in sense amplifier array B2-1 or B2-3.

The second embodiment enables a semiconductor memory device with twice the memory capacity of the device in the first embodiment to be tested in the same space of time as in the first embodiment. The number of defective columns that can be repaired in each memory cell array is less than in the first embodiment, however, because the scheme illustrated in FIGS. 8A and 8B cannot be used.

Third Embodiment

Figure 16A:
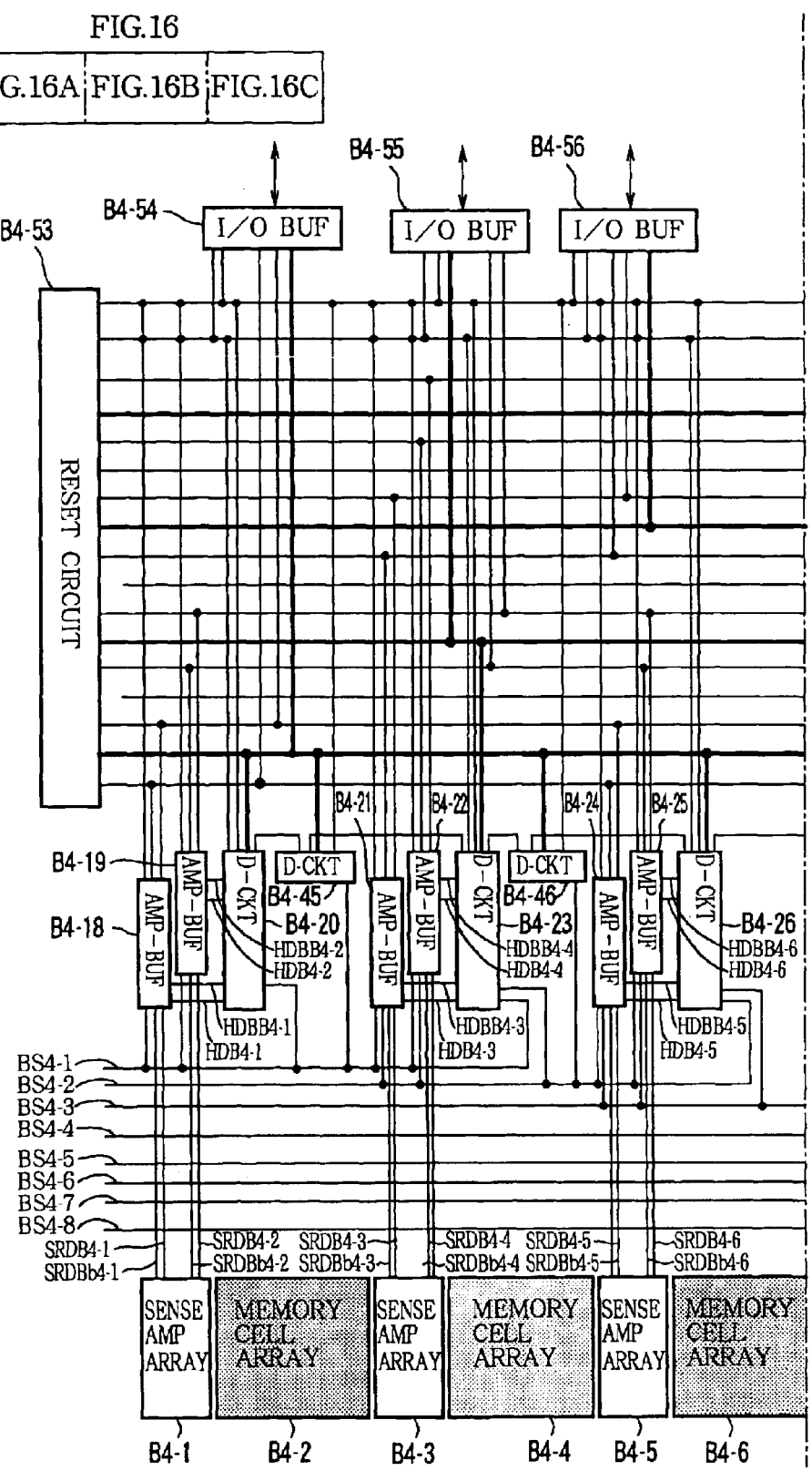
FIG. 16, consisting of FIGS. 16A, 16B, and 16C, is a block diagram of a semiconductor memory device illustrating a third embodiment of the invention.
Figure 16B:
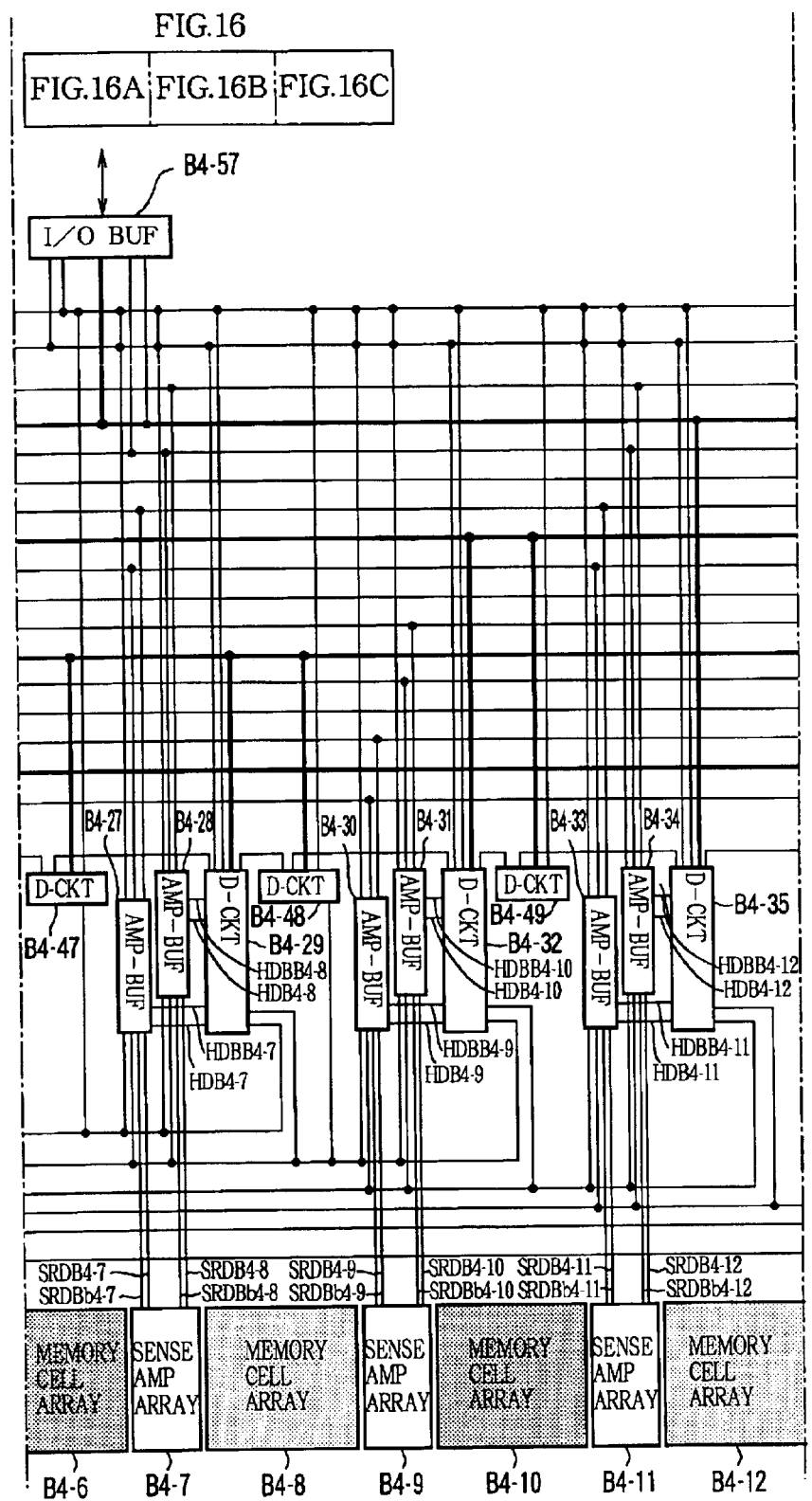
Figure 16C:
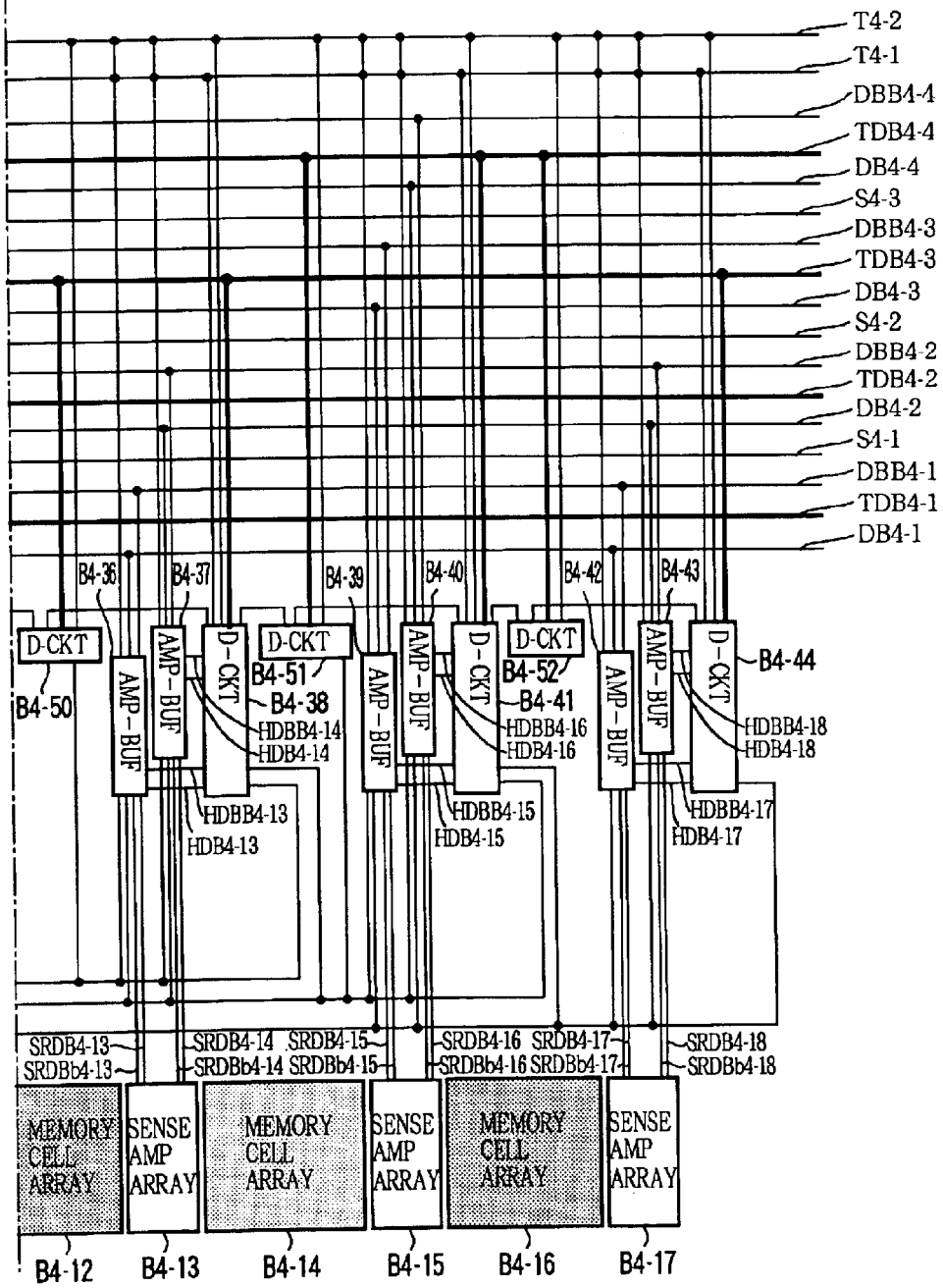

Referring to FIGS. 16A, 16B, and 16C, the third embodiment comprises the same sense amplifier arrays, memory cell arrays, output amplifier-input buffers, primary and secondary decision circuits, input-output buffers, reset circuit, data bus lines, read data bus lines, comparison data bus lines, test data bus lines, shield lines, and block select signal lines as the second embodiment. These elements are indicated by the same reference characters as in the second embodiment, except that 'B3' and 'S3' are changed to 'B4' and 'S4': for example, the first sense amplifier array is now designated B4-1, and the first block select signal line is now designated BS4-1.

The third embodiment differs from the second embodiment in having two test control signal lines T4-1 and T4-2. Both test control signal lines are connected to the output amplifier-input buffers B4-18 etc., primary decision circuits B4-20 etc., reset circuit B4-53, and input-output buffers B4-54 to B4-57. The second test control signal line T4-2 is also connected to the secondary decision circuits T4-45 to T4-52.

The third embodiment also differs from the second embodiment in that the primary decision circuits are connected to the test data bus lines as well as to the secondary decision circuits. Specifically, primary decision circuits B4-20 and B4-26 are connected to test data bus line TDB4-1, primary decision circuits B4-23 and B4-29 to test data bus line TDB4-2, primary decision circuits B4-32, B4-38, and B4-44 to test data bus line TDB4-3, and primary decision circuits B4-35 and B4-41 to test data bus line TDB4-4. Output from the primary decision circuits to the test data bus lines is enabled when the first test control signal T4-1 is active (high). Output from the secondary decision circuits to the test data bus lines is enabled when the second test control signal T4-2 is active (high).

The third embodiment differs further from the second embodiment in using the redundancy repair scheme illustrated in FIGS. 8A and 8B instead of the scheme illustrated in FIGS. 5A and 5B.

When both test control signal T4-1, T4-2 are inactive, normal read and write access are carried out as described in the first and second embodiments, by activating just one of the block select signals. Alternatively, all eight block signals can be activated to write identical test data into all eight memory cell arrays. The primary and secondary decision circuits do not drive the test data buses, which are held at a fixed potential by the reset circuit B4-53.

When the first test control signal T4-1 is activated, the output amplifier-input buffers are disconnected from the data bus lines, the primary decision circuits output comparison results to the test data bus lines, the input-output buffers output the data received from the test data bus lines TDB4-1 to TDB4-4 at the external data terminals, and the reset circuit B4-53 holds the data buses at a fixed potential level. In this mode, the memory cell arrays can be tested two at a time as described in the first embodiment, by activating two bus select lines at once. For example, bus select lines BS4-1 and BS4-5 may be activated to test memory cell arrays B4-2 and B4-10 simultaneously. The output from each input-output buffer indicates whether two bits read in a single sense amplifier array match (the normal case) or not. If the two bits do not match, the defect can be repaired by using just two redundant sense amplifiers and their connected redundant bit lines and redundant memory cells, as described in relation to FIGS. 8A and 8B.

When the second test control signal T4-2 is activated, the same test operations are performed, except that the primary decision circuits output comparison results to the secondary decision circuits, and the secondary decision circuits output further comparison results to the test data bus lines. In this mode, the memory cell arrays can be tested four at a time as described in the second embodiment, by activating four block select lines at once. For example, block select lines BS4-1, BS4-3, BS4-5, and BS4-7 may be activated to test memory cell arrays B4-2, B4-6, B4-10, and B4-14 simultaneously. The output from each input-output buffer indicates whether four bits read in a single memory cell array match (the normal case) or not. If the four bits do not match, the defect can be repaired (if the semiconductor memory device has not yet been packaged) by using four redundant sense amplifiers and the redundant bit lines and redundant memory cells connected thereto, setting the same column address in both redundancy decision circuits 14 in FIG. 8A.

The two test output modes in the third embodiment can be used selectively as follows. The first test output mode (test control signal T4-1 active) can be used in the wafer probing stage, when redundancy repair is possible, to enable the maximum number of defects to be repaired. The second test output mode (test control signal T4-2 active) can be used after the semiconductor memory device has been packaged, to shorten the test time. After the semiconductor memory device has been packaged, the fuses 20 in FIG. 8A can no longer be cut, so redundancy repair is not possible, and if any defect is found, the device will be discarded. At this stage, accordingly, the capability to repair a large number of defects is no longer relevant.

Alternatively, the second test output mode (test control signal T4-2 active) can be used in the wafer probing stage, and if two or more defects are found in the same memory cell array, the first test output mode (test control signal T4-1 active) can be used to determine whether all of the defects can be repaired, by determining whether the defective memory cells are read by different sense amplifier arrays or not.

The third embodiment thus provides the combined effects of the first and second embodiments.

Fourth Embodiment

Figure 17A:
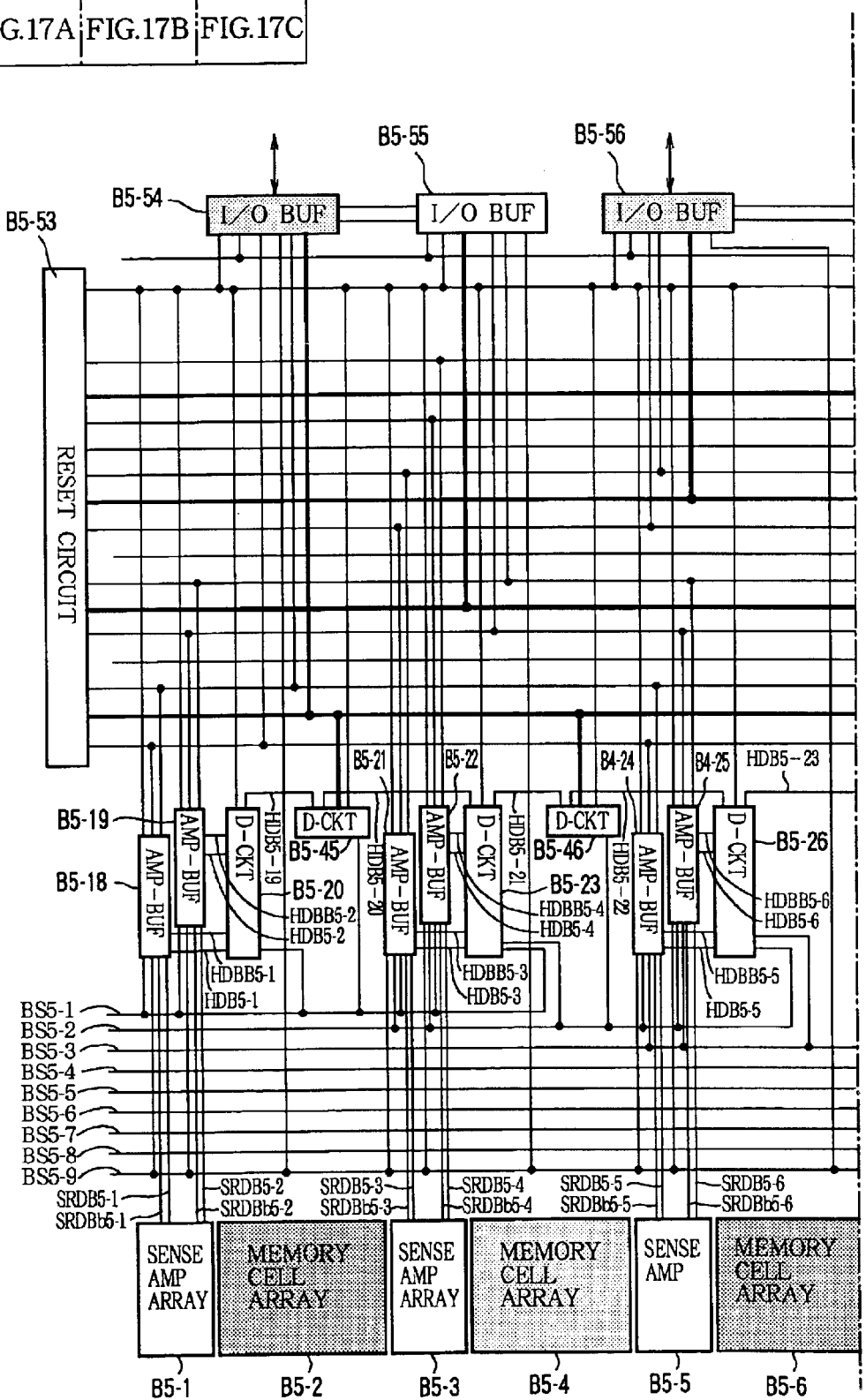
FIG. 17, consisting of FIGS. 17A, 17B, and 17C, is a block diagram of a semiconductor memory device illustrating a fourth embodiment of the invention.
Figure 17B:
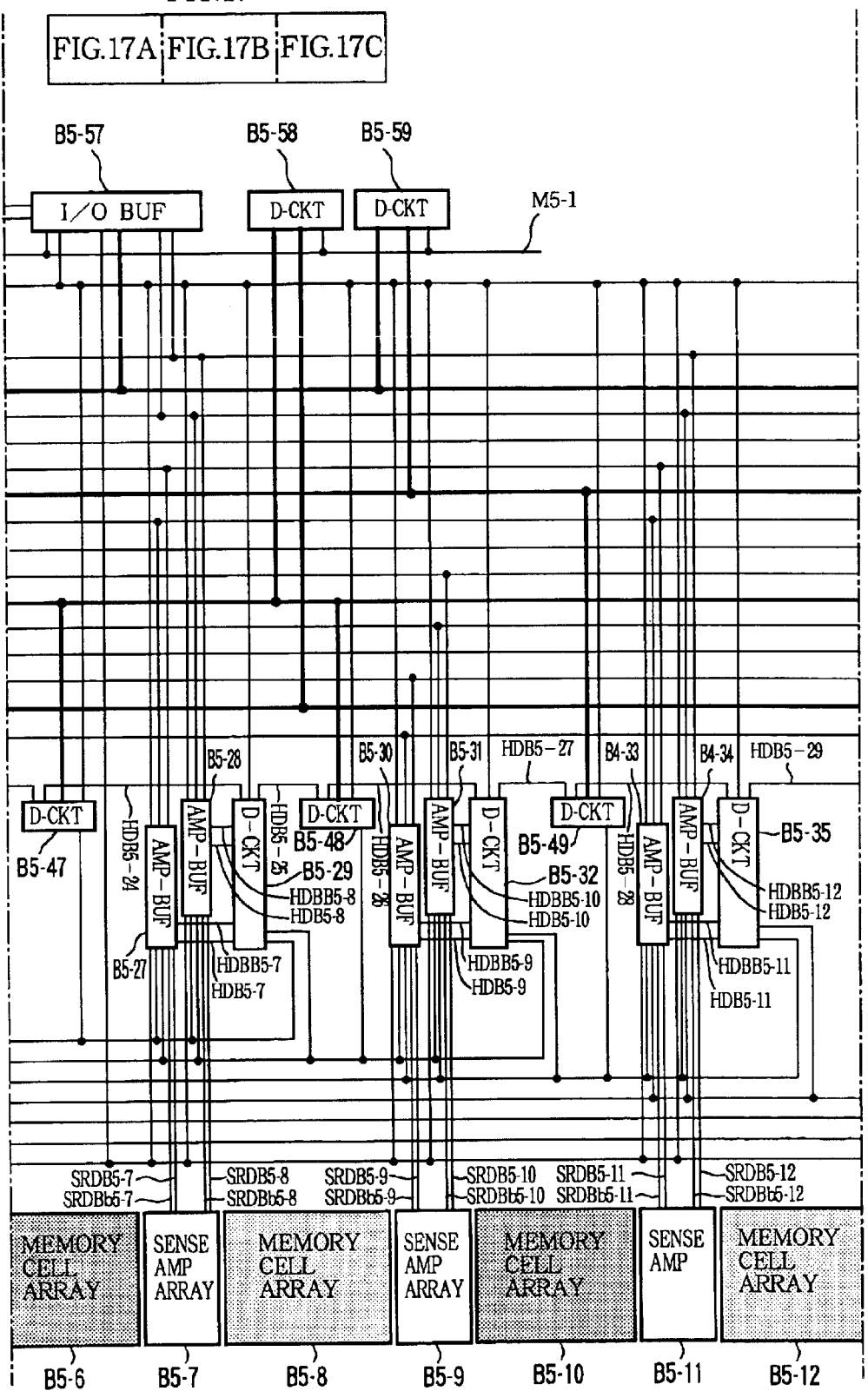
Figure 17C:
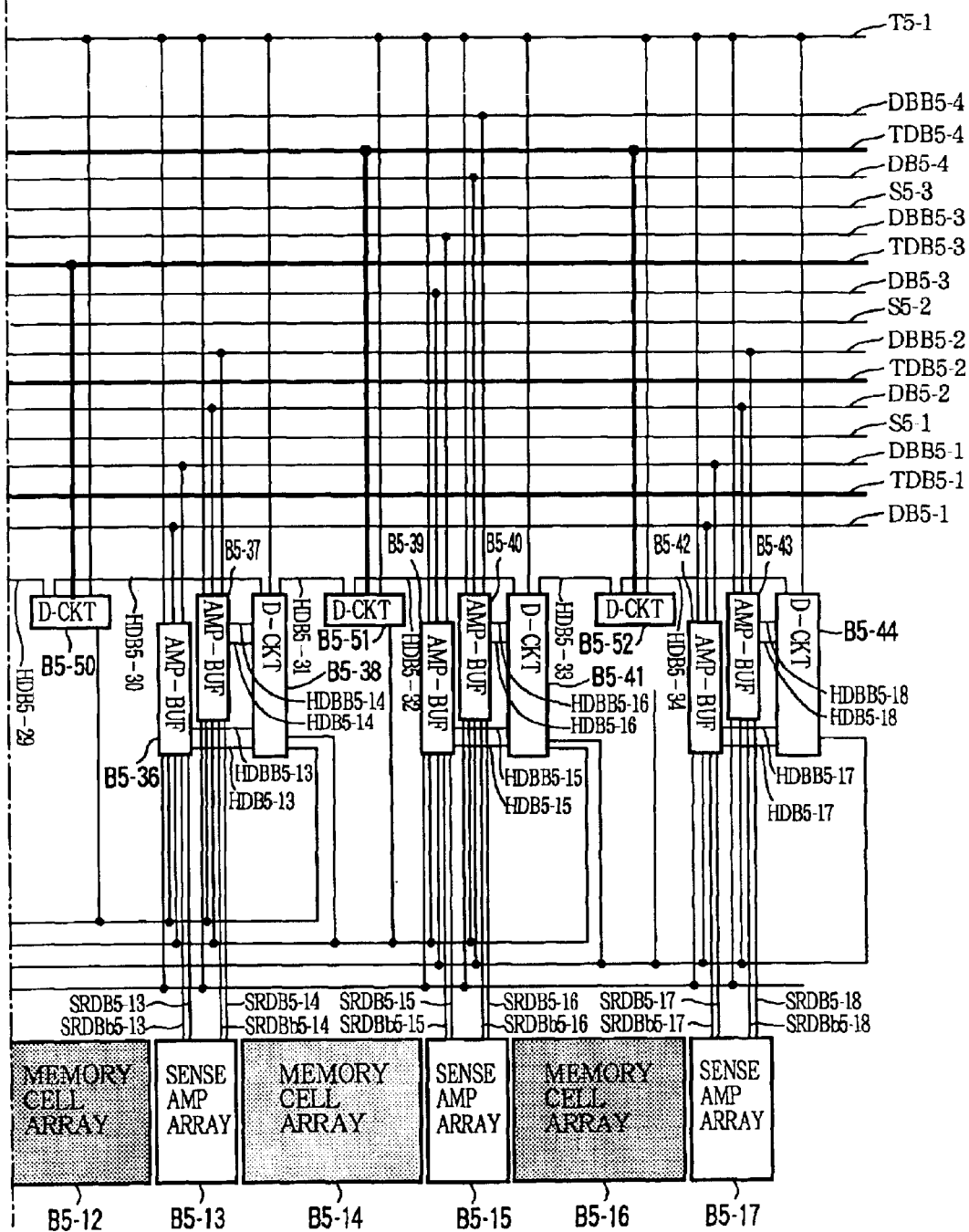

Referring to FIGS. 17A, 17B, and 17C, the fourth embodiment comprises the sense amplifier arrays, memory cell arrays, output amplifier-input buffers, primary and secondary decision circuits, input-output buffers, reset circuit, data bus lines, read data bus lines, comparison data bus lines, test data bus lines, test control signal line, shield lines, and block select signal lines shown in the second embodiment. These elements are indicated by the same reference characters as in the second embodiment, except that 'B3' and 'S3' are changed to 'B5' and 'S5': for example, the first sense amplifier array is now designated B5-1, and the first block select signal line is now designated BS5-1.

The fourth embodiment also includes two tertiary decision circuits B5-58, B5-59, a control signal line M5-1, and a ninth block select signal line BS5-9. Tertiary decision circuit B5-58 is connected to test data bus lines TDB5-1 and TDB5-2; tertiary decision circuit B5-59 is connected to test data bus lines TDB5-3 and TDB5-4. Control signal line M5-1 is connected to the input-output buffers B5-54 to B5-57 and the tertiary decision circuits B5-58, B5-59. Block select signal line BS5-9 is connected to all of the output amplifier-input buffers B5-18, B5-19 etc., and to the input-output buffers B5-54 to B5-57.

In addition, input-output buffers B5-54 and B5-55 are interconnected by a pair of complementary signal lines, and input-output buffers B5-56 and B5-57 are similarly interconnected.

Figure 18:
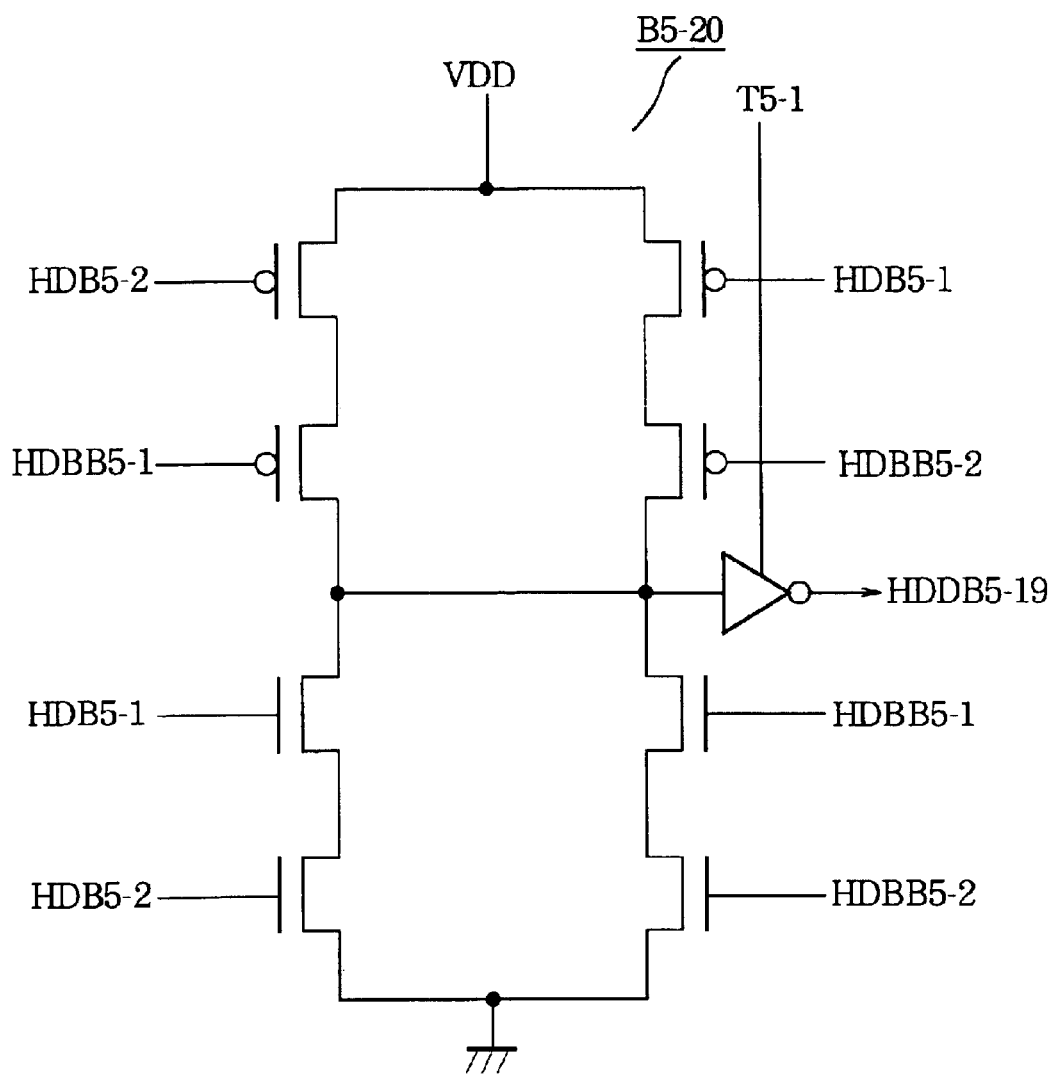
FIG. 18 is a circuit diagram illustrating the internal structure of the primary decision circuits in FIGS. 17A, 17B, and 17C.

Referring to FIG. 18, the primary decision circuits (e.g., B5-20) have the same internal structure as in the second embodiment. The secondary decision circuits (e.g., B5-45) also have the same internal structure as in the second embodiment.

Figure 19:
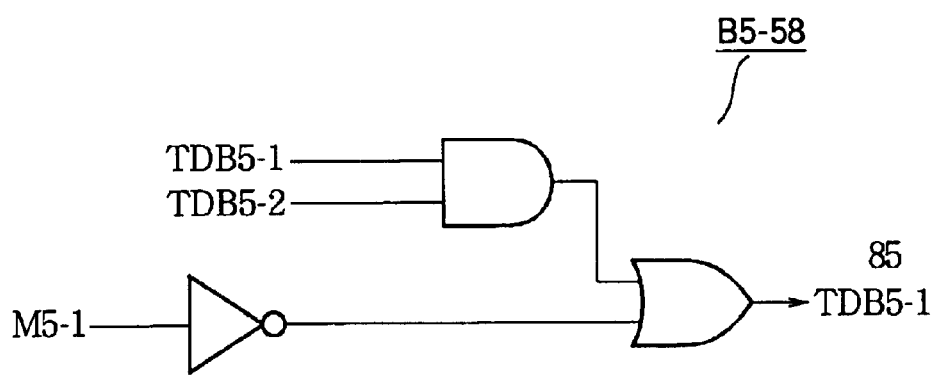
FIG. 19 is a circuit diagram illustrating the internal structure of the tertiary decision circuits in FIG. 17B.

Referring to FIG. 19, tertiary decision circuit B5-58 comprises an AND gate 501 with input terminals coupled to test data bus lines TDB5-1 and TDB5-2, an inverter 502 with an input terminal connected to the control signal line M5-1, and an OR gate 503 with input terminals connected to the output terminals of the AND gate 501 and inverter 502. The output terminal of the OR gate 503 is connected to test data bus line TDB5-1.

Tertiary decision circuit B5-59 has a similar structure, except that the input terminals of the AND gate are connected to test data bus lines TDBS-3 and TDB5-4 and the output terminal of the OR gate is connected to test data bus line TDB5-3.

The fourth embodiment allows the same semiconductor memory device to be used for either two-bit or four-bit parallel data input and output. In the four-bit parallel mode, control signal M5-1 is held at the low level, and the fourth embodiment operates in substantially the same way as the second embodiment. In the test output mode, although the tertiary decision circuits B5-58, B5-59 place high output signals on test data bus lines TDB5-1 and TDB5-3, if one of the secondary decision circuits generates a low output on the same test data bus line, the test data bus line is pulled down far enough for the input-output buffer to which it is connected to generate a low external output signal.

Wafer probing tests are preferably carried out in the four-bit parallel input/output mode, enabling defective memory cells to be isolated to a particular memory cell array, after which redundancy repair can be carried out by the scheme illustrated in FIGS. 5A and 5B.

In the two-bit parallel mode, only input-output buffers B5-54 and B5-56 are connected to external data terminals, as shown in the drawing, and an extra address signal input terminal (not shown) is provided to enable memory cells to be selected two at a time instead of four at a time. Control signal M5-1 is held at the high level. During normal read and write access, when the extra address signal has one value (e.g., '0'), data are transferred between input-output buffer B5-54 and data bus lines DB5-1 and DBB5-1, and between input-output buffer B5-56 and data bus lines DB5-3 and DBB5-3. When the extra address signal has another value (e.g., '1'), data are transferred between input-output buffer B5-54 and data bus lines DB5-2 and DBB5-2 via input-output buffer B5-55, and between input-output buffer B5-56 and data bus lines DB5-4 and DBB5-4 via input-output buffer B5-57.

In the two-bit parallel input/output mode, to write identical test data into all memory cell arrays simultaneously, the ninth block select signal BS5-9 is activated. The two bits input at the external data terminals are transferred simultaneously to all four pairs of data bus lines. For example, the data input to input-output buffer B5-54 are transferred directly to data bus lines DB5-1 and DBB5-1, and at the same time are transferred via input-output buffer B5-55 to data bus lines DB5-2 and DBB5-2. Thirty-two bits are thereby written simultaneously into the memory cell arrays, enabling the test data to be written in the same space of time as in the second embodiment, even though only two external data terminals are used.

When the test control signal T5-1 is activated to read the test data, the ninth block select signal line BS5-9 is deactivated and four of the other block select signals are activated, e.g. BS5-1, BS5-3, BS5-5, and BS5-7, as in the second embodiment. Four of the secondary decision circuits, e.g. secondary decision circuits B5-45, B5-47, B5-49, B5-51 produce comparison result indicating whether the data read from the corresponding memory cell arrays are normal or not, and place these results on test data bus lines TDB5-1 to TDB5-4 as described in the second embodiment.

If, for example, the data read from memory cell arrays B5-2 and B5-6 are all normal, then test data bus lines TDB5-1 and TDB5-2 are both left at the high level. Consequently, both inputs to the AND gate 501 in tertiary decision circuit B5-58 are high, and the output of the OR gate 503 in tertiary decision circuit B5-58 is high, so that test data bus line TDB5-1 remains at the high level. Input-output buffer B5-54 accordingly produces a high output signal at its connected external data terminal.

If one of the bits of data read from memory cell array B5-2 is defective, then secondary decision circuit B5-45 pulls test data bus line TDB5-1 down to the low level as described in the second embodiment. Tertiary test data bus B5-58 also pulls test data bus line TDB5-1 down to the low level, since one of the inputs to AND gate 501 is low, making the output of OR gate 503 go low. Input-output buffer B5-54 accordingly produces a low output signal at its connected external data terminal.

If one of the bits of data read from memory cell array B5-6 is defective, secondary decision circuit B5-47 pulls test data bus line TDB5-2 down to the low level. Tertiary decision circuit B5-58 then pulls test data bus line TDB5-1 down to the low level, since one of the inputs to AND gate 501 in tertiary decision circuit B5-58 is low, making the output of its OR gate 503 go low. Even if secondary decision circuit B5-45 generates high output on test data bus line TDB5-1, the pull-down effect of tertiary decision circuit B5-58 is strong enough to cause input-output buffer B5-54 to produce a low output signal at its connected external data terminal.

If defective bits are read from both memory cell arrays B5-2 and B5-6, then both data bus lines TDB5-1 and TDB5-2 go low, and input-output buffer B5-54 produces a low output signal at its connected external data terminal.

Input-output buffer B5-56 and tertiary decision circuit B5-59 operate in a similar way to output test result data for memory cell arrays B5-10 and B5-14.

The reading of test data in this mode is completed in the same space of time as in the second embodiment, despite the use of only two external data terminals. When a defective bit is found, however, it is not possible to isolate the bit to a particular memory cell array. This test is therefore preferably used only for pass-fail screening of the packaged memory devices, after redundancy repair is no longer possible.

If it is necessary to isolate a defect to a particular memory cell array in the two-bit parallel input/output mode, this can be done by reading data from only two memory cell arrays at a time (for example, by activating only block select signals BS5-1 and BS5-5) although it will then take twice as long to read the test data.

The present invention is not limited to the embodiments described above. For example, the number of memory cell arrays is not limited to four or eight. The number of output amplifier-input buffers connected to each sense amplifier array is not limited to two; there may be more than two output amplifier-input buffers, or only one. The number of external data terminals is not limited to two or four; there may be any number of external data terminals, including only one. Signals described as active high in the embodiments may be active low instead, if suitable modifications are made in the logic circuitry that processes the signals. The features of the third and fourth embodiments may be combined. The sense amplifiers may have a cross-coupled circuit configuration, so that they can refresh the data in the memory cells. The redundancy repair circuitry is not limited to the circuits shown in the drawings.

Those skilled in the art will recognize that further variations are possible within the scope of the invention, which is defined in the appended claims.

What is claimed is:

1. A semiconductor memory device operable in a normal output mode and a test output mode, comprising:

a first array of memory cells;

a first array of sense amplifiers for reading data from the first array of memory cells;

a plurality of column lines coupled to the first array of sense amplifiers, each column line selecting at least two of the sense amplifiers in the first array of sense amplifiers;

a plurality of data bus lines receiving the data read by the selected sense amplifiers in the first array of sense amplifiers;

a first decision circuit receiving and comparing data read by two of the selected sense amplifiers in the first array of sense amplifiers and generating comparison result data; and a first input-output buffer receiving data from at least one of the data bus lines in the normal output mode, receiving the comparison result data from the first decision circuit in the test output mode, and providing external output of the received data.

2. The semiconductor memory device of claim 1, further comprising a test data bus line linking the first decision circuit to the first input-output buffer.

3. The semiconductor memory device of claim 2, wherein the data bus lines include a complementary pair of data bus lines and the test data bus line is disposed between the complementary pair of data bus lines.

4. The semiconductor memory device of claim 1, further comprising:

a redundant array of memory cells;

a plurality of redundant sense amplifiers for reading data from the redundant array of memory cells and supplying the read data to the data bus lines;

a redundancy decision circuit programmable to replace at least two of the sense amplifiers in the first array of sense amplifiers with at least two of the redundant sense amplifiers.

5. The semiconductor memory device of claim 1, further comprising:

a second array of sense amplifiers for reading data from the first array of memory cells, each column line also selecting at least two of the sense amplifiers in the second array of sense amplifiers;

a second decision circuit for receiving and comparing data read by two of the selected sense amplifiers in the second array of sense amplifiers and generating comparison result data; and a second input-output buffer receiving data from at least another one of the data bus lines in the normal output mode, receiving the comparison result data from the second decision circuit in the test output mode, and providing external output of the received data.

6. The semiconductor memory device of claim 5, further comprising:

a redundant array of memory cells;

a plurality of first redundant sense amplifiers for reading data from the redundant array of memory cells and supplying the read data to the data bus lines;

a first redundancy decision circuit programmable to replace at least two of the sense amplifiers in the first array of sense amplifiers with at least two of the first redundant sense amplifiers;

a plurality of second redundant sense amplifiers for reading data from the redundant array of memory cells and supplying the read data to the data bus lines; and a second redundancy decision circuit programmable to replace at least two of the sense amplifiers in the second array of sense amplifiers with at least two of the second redundant sense amplifiers.

7. The semiconductor memory device of claim 1, further comprising:

a second array of memory cells;

a second array of sense amplifiers for reading data from the second array of memory cells, each column line also selecting at least two of the sense amplifiers in the second array of sense amplifiers, the first and second arrays of sense amplifiers both providing data to the same plurality of data bus lines;

a second decision circuit for receiving and comparing data read by two of the selected sense amplifiers in the second array of sense amplifiers and generating comparison result data; and a second input-output buffer receiving data from at least another one of the data bus lines in the normal output mode, receiving the comparison result data from the second decision circuit in the test output mode, and providing external output of the received data.

8. The semiconductor memory device of claim 1, further comprising:

second, third, and fourth arrays of memory cells;

a second array of sense amplifiers selectable at least two at a time by the column signal lines, for reading data from the first memory cell array and the second memory cell array;

a third array of sense amplifiers selectable at least two at a time by the column signal lines, for reading data from the second memory cell array and the third memory cell array;

a fourth array of sense amplifiers selectable at least two at a time by the column signal lines, for reading data from the third memory cell array and the fourth memory cell array;

a fifth array of sense amplifiers selectable at least two at a time by the column signal lines, for reading data from the fourth memory cell array;

a second decision circuit for receiving and comparing data read by two of the selected sense amplifiers in the second array of sense amplifiers and generating comparison result data;

a third decision circuit for receiving and comparing data read by two of the selected sense amplifiers in the third array of sense amplifiers and generating comparison result data;

a fourth decision circuit for receiving and comparing data read by two of the selected sense amplifiers in the fourth array of sense amplifiers and generating comparison result data;

a fifth decision circuit for receiving and comparing data read by two of the selected sense amplifiers in the fifth array of sense amplifiers and generating comparison result data;

a second input-output buffer receiving data from at least another one of the data bus lines in the normal output mode, receiving the comparison result data from the second decision circuit in the test output mode, and providing external output of the received data;

a third input-output buffer receiving data from at least yet another one of the data bus lines in the normal output mode, receiving the comparison result data from the third decision circuit in the test output mode, and providing external output of the received data; and a fourth input-output buffer receiving data from at least still another one of the data bus lines in the normal output mode, receiving the comparison result data from the fourth decision circuit in the test output mode, and providing external output of the received data;

wherein the first input-output buffer also receives the comparison result data from the fifth decision circuit; and in the test output mode, data are read simultaneously either from the first and third arrays of memory cells, or from the second and fourth arrays of memory cells.

9. A semiconductor memory device operable in a normal output mode and a first test output mode, comprising:

a plurality of column signal lines;

a plurality of arrays of sense amplifiers, the sense amplifiers in each array being selectable at least two at a time by the column signal lines;

a plurality of memory cell arrays interspersed among the sense amplifier arrays so that data stored in each memory cell array are read by sense amplifiers in two adjacent arrays of sense amplifiers;

a plurality of data bus lines for receiving data read from the memory cell arrays by the sense amplifiers in the sense amplifier arrays;

a plurality of primary decision circuits connected to respective arrays of sense amplifiers, each primary decision circuit comparing data read by two of the selected sense amplifiers in the connected one of the arrays of sense amplifiers and generating first comparison result data;

a plurality of secondary decision circuits for comparing the first comparison result data generated by adjacent pairs of the primary decision circuits and generating second comparison result data; and a plurality of input-output buffers receiving data from the data bus lines in the normal output mode, receiving the second comparison result data from the secondary decision circuits in the first test output mode, and providing external output of the received data.

10. The semiconductor memory device of claim 9, further comprising a plurality of test data bus lines linking the secondary decision circuits to the input-output buffers.

11. The semiconductor memory device of claim 10, wherein each of the test data bus lines is disposed between a pair of the data bus lines, different test data bus lines being disposed between different pairs of the test data bus lines.

12. The semiconductor memory device of claim 9, further comprising:

a plurality of redundant arrays of memory cells;

a plurality of redundant sense amplifiers for reading data from the redundant arrays of memory cells and supplying the read data to the data bus lines;

a plurality of redundancy decision circuits, each redundancy decision circuit being programmable to replace at least two of the sense amplifiers in each of two adjacent arrays of sense amplifiers with at least two of the redundant sense amplifiers.

13. The semiconductor memory device of claim 9, wherein there are N input-output buffers and at least 2N memory cell arrays, N being a positive integer, the memory cell arrays being tested N at a time in the first test output mode.

14. The semiconductor memory device of claim 9, also operable in a second test output mode in which the input-output buffers receive first comparison result data from the primary decision circuits, and provide external output of the received data.

15. The semiconductor memory device of claim 14, wherein there are N input-output buffers and at least 2N memory cell arrays, N being an even positive integer, the memory cell arrays being tested N at a time in the first test output mode and N/2 at a time in the second test output mode.

16. The semiconductor memory device of claim 14, further comprising:
   a plurality of redundant arrays of memory cells;
   a plurality of redundant sense amplifiers for reading data from the redundant arrays of memory cells and supplying the read data to the data bus lines;
   a plurality of redundancy decision circuits, each redundancy decision circuit being programmable to replace at least two of the sense amplifiers in one of the arrays of sense amplifiers with at least two of the redundant sense amplifiers.

17. The semiconductor memory device of claim 16, wherein the second test output mode is used to obtain information for programming the redundancy decision circuits, and the first test output mode is used for pass-fail inspection of the semiconductor memory device.

18. The semiconductor memory device of claim 9, wherein the input-output buffers include a first group of input-output buffers and a second group of input-output buffers, use of the second group of input-output buffers for external output being optional, the first group of input-output buffers providing external output of data received by the second group of input-output buffers when the second group of input-output buffers are not used for external output, the semiconductor memory device further comprising:
   a plurality of tertiary decision circuits for comparing the second comparison result data generated by pairs of the secondary decision circuits, generating third comparison result data, and supplying the third comparison result data to the first group of input-output buffers when the second group of input-output buffers are not used for external output.

19. The semiconductor memory device of claim 18, further comprising a block select signal line for selecting all of the memory cell arrays, thereby enabling data input through the first group of input-output buffers to be written into all of the memory cell arrays simultaneously.

* * * * *